(12) United States Patent
Lin

(10) Patent No.: US 7,119,591 B1
(45) Date of Patent: Oct. 10, 2006

(54) DELAY-LOCKED LOOP (DLL) INTEGRATED CIRCUITS HAVING BINARY-WEIGHTED DELAY CHAIN UNITS WITH BUILT-IN PHASE COMPARATORS THAT SUPPORT EFFICIENT PHASE LOCKING

(75) Inventor: James K. Lin, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 76 days.

(21) Appl. No.: 10/891,919

(22) Filed: Jul. 15, 2004

Related U.S. Application Data

(63) Continuation-in-part of application No. 10/880,804, filed on Jun. 30, 2004.

(60) Provisional application No. 60/534,318, filed on Jan. 5, 2004.

(51) Int. Cl.
*G01R 15/12* (2006.01)
(52) U.S. Cl. ................... 327/158; 327/161; 327/149
(58) Field of Classification Search ........ 327/147–149, 327/156–159, 161
See application file for complete search history.

(56) References Cited

U.S. PATENT DOCUMENTS

| | | | |
|---|---|---|---|
| 5,317,219 A | 5/1994 | Lupi et al. ................... 307/603 |
| 5,374,860 A | 12/1994 | Llewellyn ................... 327/276 |
| 5,485,490 A | 1/1996 | Leung et al. ................ 375/371 |
| 5,515,403 A * | 5/1996 | Sloan et al. ................ 375/371 |
| 5,561,692 A | 10/1996 | Maitland et al. ............ 375/371 |
| 5,614,855 A | 3/1997 | Lee et al. ................... 327/158 |
| 5,719,515 A | 2/1998 | Danger ....................... 327/270 |
| 5,818,769 A | 10/1998 | Tweed et al. ................ 365/194 |
| 5,828,257 A | 10/1998 | Masleid ...................... 327/276 |
| 5,844,954 A | 12/1998 | Casasanta et al. .......... 375/373 |
| 5,847,616 A | 12/1998 | Ng et al. ....................... 331/57 |
| 5,910,740 A | 6/1999 | Underwood ................. 327/149 |
| 5,923,597 A | 7/1999 | Tweed et al. ................ 365/194 |
| 6,125,157 A | 9/2000 | Donnelly et al. ........... 375/371 |
| 6,134,180 A | 10/2000 | Kim et al. ................... 365/233 |
| 6,194,937 B1 | 2/2001 | Minami ....................... 327/270 |
| 6,239,892 B1 | 5/2001 | Davidson .................... 359/135 |
| 6,255,969 B1 | 7/2001 | Crayford .................... 341/100 |
| 6,275,899 B1 | 8/2001 | Savell et al. ................ 711/118 |
| 6,285,172 B1 | 9/2001 | Torbey ........................ 323/237 |

(Continued)

OTHER PUBLICATIONS

Dehng et al., Clock-Deskew Buffer Using a SAR-Controlled Delay-Locked Loop, IEEE Journal of Solid-State Circuits, vol. 35, No. 8, Aug. 2000, pp. 1128-1136.

(Continued)

*Primary Examiner*—Dinh T. Le
(74) *Attorney, Agent, or Firm*—Myers Bigel Sibley & Sajovec

(57) ABSTRACT

Delay-locked loop integrated circuits include a delay chain having a plurality of delay chain units. The delay chain may be a binary-weighted delay chain and the delay chain units may be arranged in ascending or descending order (e.g., x1, x2, x4, x8, . . . ) according to delay. Each of the plurality of delay chain units may include a respective phase comparator. Each phase comparator is configured to identify whether a delay provided by the corresponding delay chain unit exceeds a fraction of a period of a reference clock signal applied to an input of the delay chain. This fraction of a period may be equivalent to one-half or other percentage of a period of the reference clock signal. The phase comparators with the delay chain units operate to generate a multi-bit delay value signal, which is provided to a delay chain control circuit.

7 Claims, 16 Drawing Sheets

U.S. PATENT DOCUMENTS

| | | | |
|---|---|---|---|
| 6,285,229 B1 | 9/2001 | Chu et al. | 327/277 |
| 6,288,574 B1 | 9/2001 | Neary | 327/12 |
| 6,313,621 B1 | 11/2001 | Zwack | 324/76.52 |
| 6,313,676 B1 | 11/2001 | Abe et al. | 327/158 |
| 6,348,827 B1 | 2/2002 | Fifield et al. | 327/278 |
| 6,356,099 B1 | 3/2002 | Lee et al. | 326/24 |
| 6,356,158 B1 | 3/2002 | Lesea | 331/11 |
| 6,359,489 B1 | 3/2002 | Huang | 327/291 |
| 6,366,150 B1 | 4/2002 | Ishimi | 327/276 |
| 6,400,202 B1 | 6/2002 | Fifield et al. | 327/291 |
| 6,411,142 B1 | 6/2002 | Abbasi et al. | 327/156 |
| 6,424,228 B1 | 7/2002 | Ahn et al. | 331/1 A |
| 6,469,493 B1 * | 10/2002 | Muething et al. | 324/158.1 |
| 6,477,110 B1 | 11/2002 | Yoo et al. | 365/233 |
| 6,539,072 B1 | 3/2003 | Donnelly et al. | 375/371 |
| 6,664,838 B1 | 12/2003 | Talledo | 327/277 |

OTHER PUBLICATIONS

Minami et al., A 1-GHz Portable Digital Delay-Locked Loop with Infinite Phase Capture Ranges, IEICE Trans. Electron., vol. E84-C, No. 2, Feb. 2001, pp. 220-228.

Okajima et al., "Digital Delay Locked Loop and Design Technique for High-Speed Synchronous Interface," IEICE Trans. Electron., vol. E79-C, No. 6, Jun. 1996, pp. 798-806.

Ryan, Kevin, "DDR SDRAM Functionality and Controller Read Data Capture," Micron Technology, Inc., vol. 8, Issue 3, 1999, pp. 1-24.

Lee et al., "A 2.5 V CMOS Delay-Locked Loop for an 18 Mbit, 500 Megabyte/s DRAM," IEEE Journal of Solid-State Circuits, vol. 29, No. 12, Dec. 1994, pp. 1491-1496.

* cited by examiner

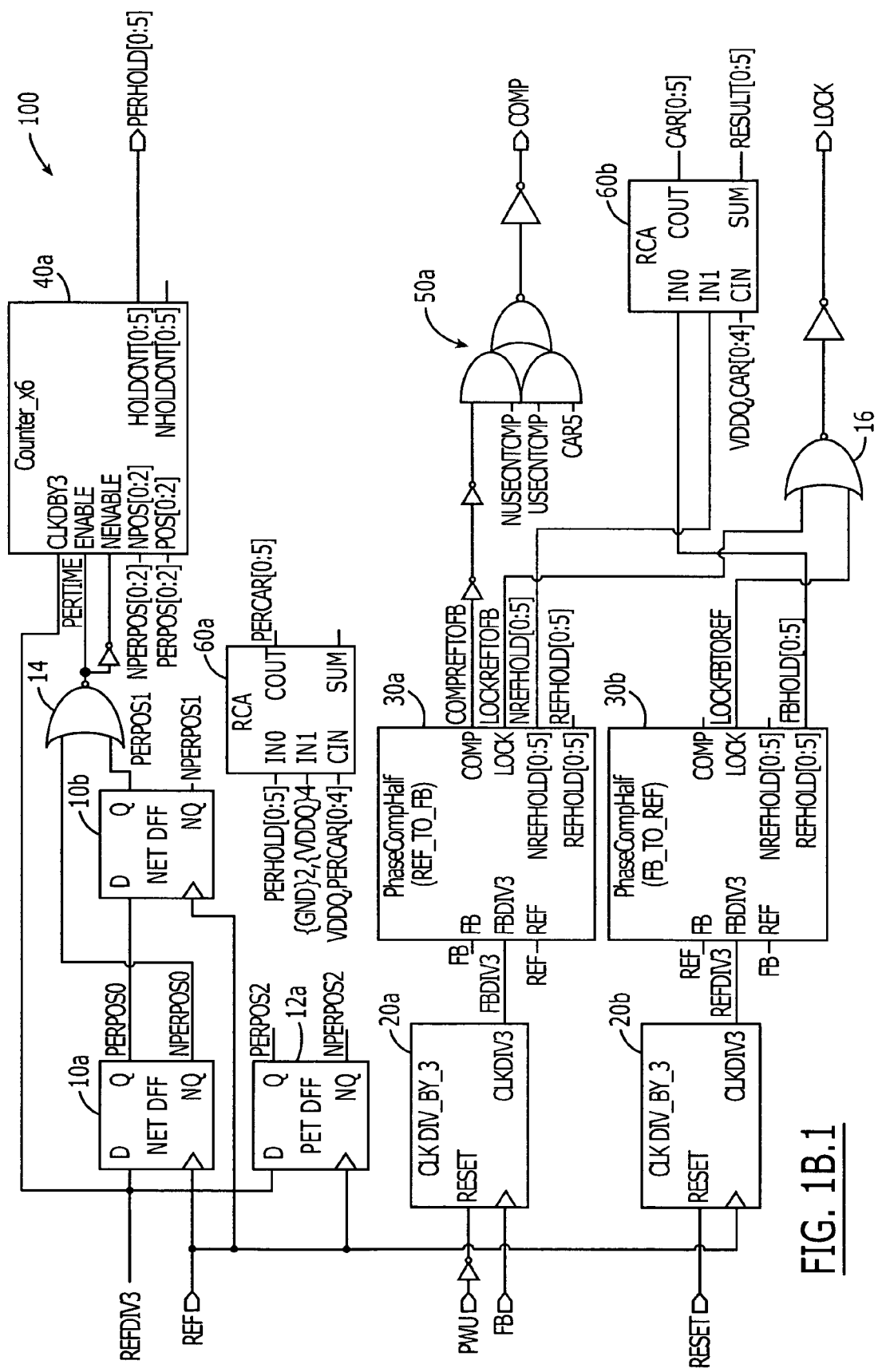
FIG. 1B.1

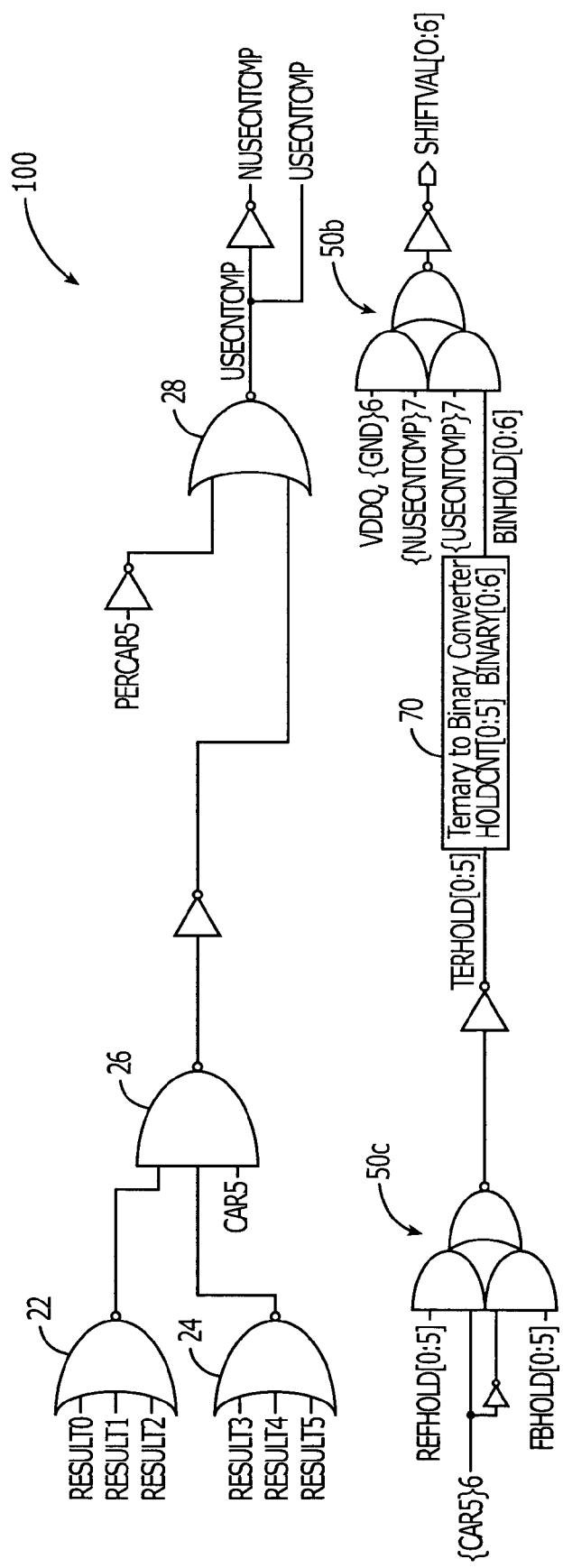
FIG. 1B.2

DELAY-LOCKED LOOP (DLL) INTEGRATED CIRCUITS HAVING BINARY-WEIGHTED DELAY CHAIN UNITS WITH BUILT-IN PHASE COMPARATORS THAT SUPPORT EFFICIENT PHASE LOCKING

REFERENCE TO PRIORITY APPLICATIONS

This application is a continuation-in-part (CIP) of U.S. application Ser. No. 10/880,804, filed Jun. 30, 2004, which claims priority to U.S. Provisional Application Ser. No. 60/534,318, filed Jan. 5, 2004, the disclosures of which are hereby incorporated herein by reference.

FIELD OF THE INVENTION

The present invention relates to integrated circuit devices and, more particularly, to delay locked loop integrated circuit devices and methods of operating same.

BACKGROUND OF THE INVENTION

Phase-locked loop (PLL) and delay-locked loop (DLL) integrated circuits are frequently used to generate highly accurate internal clock signals on integrated circuit substrates (e.g., chips). These PLL and DLL integrated circuits may utilize phase comparators that compare a phase of a primary clock signal, such as a reference clock signal REF, to that of a secondary clock signal, such as a feedback clock signal FB. Phase comparators may generate output signals, such as a LOCK signal, which indicates whether the primary and secondary clock signals are in phase relative to each other (within some acceptable tolerance), and a COMP signal, which indicates whether the phase of the primary clock signal leads or lags the phase of the secondary clock signal when the two signals are not in phase relative to each other. If the COMP signal indicates a leading condition between the primary and secondary clock signals, then the PLL (or DLL) may operate to speed up the phase of the secondary clock signal. Alternatively, if the COMP signal indicates a lagging condition between the primary and secondary clock signals, then the PLL (or DLL) may operate to slow down the phase of the secondary clock signal. Conventional phase comparators may generate the LOCK signal by evaluating the presence or absence of a leading edge of the secondary clock signal within a time window centered about a leading edge of the primary clock signal. This time window is frequently referred to as a transition detection window. For high frequency applications, a relatively small transition detection window is required.

In particular, phase comparison operations may use an edge transition of one clock signal to capture a value (0 or 1) of another clock signal. For example, if a rising edge of a feedback clock signal FB captures a reference clock signal REF having a logic 1 value, then the COMP signal will cause FB to be advanced in time. Alternatively, if a rising edge of the feedback clock signal FB captures a reference clock signal REF having a logic 0 value, then the COMP signal will cause FB to be delayed in time. As will be understood by those of ordinary skill in the art, if the phases of FB and REF are different by an integer multiple of one-half the period (T) of the reference clock signal REF, then it will not matter whether the COMP signal indicates that the feedback clock signal FB should be slowed down or accelerated to obtain a phase lock condition.

Operations to generate a LOCK signal within a phase comparator typically will work so long as the transition detection window is shorter than the period of the primary clock signal, and it typically does not matter whether the duty cycle of the primary clock signal is unity or not. However, operations to generate a COMP signal typically assume that the duty cycle of the primary clock signal is unity. When this is the case, the probabilities of capturing a logic 1 value or a logic 0 value are equivalent when comparing the relative phases of the primary and secondary clock signals. But, when the duty cycle of the primary clock signal is not unity, operations to generate a COMP signal and achieve phase lock between the primary and secondary clock signals may be inefficient. For example, if the duty cycle of the primary clock signal is 0.25 and a conventional linear search routine is used to achieve phase lock, then a worst case time shift of 80% of the period of the primary clock signal will need to be made to the secondary clock signal before phase lock is achieved. This is because a duty cycle of 0.25 corresponds to a primary clock signal that is high 20% of the time and low 80% of the time. Accordingly, if the secondary clock signal captures a logic 0 value of the primary clock signal immediately after a high-to-low transition of the primary clock signal, then the COMP signal will specify that the secondary clock signal needs to be slowed down to achieve phase lock. However, as the secondary clock signal is gradually slowed down, the secondary clock signal will repeatedly capture logic 0 values until time units providing a total of 80% of the period of the primary clock signal have been added to the phase of the secondary clock signal. A potentially better alternative in this case involves speeding up the secondary clock signal by only 20% of the period of the primary clock signal, but the conventional phase comparator has no way of knowing which shift direction (slower or faster) will achieve the faster lock condition. Furthermore, the relatively high degree of inefficiency in the phase locking operations may actually increase if a conventional binary search routine is used in place of the linear search routine.

SUMMARY OF THE INVENTION

Embodiments of the present invention include delay-locked loop (DLL) and phase-locked loop (PLL) integrated circuits that support efficient phase locking of clock signals having non-unity duty cycles. These locked loop integrated circuits include digital phase comparators that are unaffected by variable duty cycle ratios because they determine a shortest direction to phase lock before establishing a value of a compare signal (COMP) that specifies the shortest direction. In particular, a phase comparator is provided that is responsive to a reference clock signal REF and a feedback clock signal FB. These clock signals have equivalent periods and may have equivalent non-unity duty cycle ratios. This phase comparator is configured to determine whether a first degree to which the reference clock signal REF leads the feedback clock signal FB is smaller or larger than a second degree to which the reference clock signal REF lags the feedback clock signal FB. Based on this determination, the phase comparator generates a compare signal COMP that identifies a direction in time the feedback clock signal FB should be shifted to bring it into alignment with the reference clock signal REF. This direction represents a speed-up direction when the first degree is determined to be less than the second degree or a slow-down direction when the second degree is determined to be less than the first degree.

The phase comparator is further configured to generate a shift value signal (SHIFTVAL) that specifies an amount the feedback clock signal FB needs to be shifted to bring it into alignment with the reference clock signal REF. In many cases, the generation of this shift value signal supports a reduction in the number of feedback delay adjustments that are made by the locked loop integrated circuit to just two adjustments. This aspect of the phase comparator may surpass conventional phase comparators that support binary search routines, yet nonetheless typically require more than two phase adjustments to obtain a lock condition.

Additional embodiments of the present invention include phase comparators that generate a period value signal (PER-HOLD) that specifies the period of the reference clock signal REF. This period value signal can be used by a locked loop integrated circuit to generate phase delayed outputs. These phase comparators may also be configured to generate a lock signal LOCK that identifies whether or not the reference and feedback clock signals are aligned with each other. The operations to generate the LOCK signal include logically ORing a first lock signal, which specifies whether a leading edge of the reference clock signal REF is within a first time window relative to a leading edge of the feedback clock signal FB, with a second lock signal, which specifies whether the leading edge of the feedback clock signal FB is within a second time window relative to the leading edge of the reference clock signal REF. The first and second time windows may be equivalent.

Delay-locked loop integrated circuits according to additional embodiments of the present invention include a delay chain having a plurality of delay chain units therein. The delay chain may be a binary-weighted delay chain and the delay chain units may be arranged in ascending or descending order (e.g., x1, x2, x4, x8, . . . ) according to delay, however, other configurations (e.g., random) are also possible. Each of the plurality of delay chain units may include a respective phase comparator. Each phase comparator is configured to identify whether a delay provided by the corresponding delay chain unit exceeds a fraction of a period of a reference clock signal applied to an input of the delay chain. This fraction of a period may be equivalent to one-half or other portion of a period of the reference clock signal. The phase comparators within the delay chain units operate to generate a multi-bit delay value signal, which is provided as an input to a delay chain control circuit.

Each of the plurality of delay chain units may be configured to support a respective delay path and a respective bypass path therein. When the respective delay path is enabled, the delay chain unit adds a rated delay to the delay chain using a delay element (e.g., inverter string). However, when the bypass path is enabled, the delay element within the delay chain unit is bypassed, which means the delay chain unit is essentially removed from the delay chain. The delay chain may be responsive to a multi-bit delay unit enable signal having a value that identifies which ones of the delay paths are active within the plurality of delay chain units. The present invention, the delay element in each of the plurality of delay chain units may be a respective inverter delay line. In such embodiments, the phase comparator in each of the plurality of delay chain units may have inputs that tap off at least two nodes of the corresponding inverter delay line.

The delay chain control circuit may include a system clock generator therein that synchronizes at least some operations performed by the delay-locked loop. This system clock generator may include a plurality of clock dividers, which are responsive to the reference clock signal, and a clock selector. This clock select is configured to select an output of one of the plurality of clock dividers as a system clock, in response to the multi-bit delay value signal generated by the delay chain. In some embodiments, this multi-bit delay value signal may undergo encoding/decoding operations before being provided to the clock selector.

Further embodiments of the present invention include methods of operating locked loop integrated circuits. These methods may include evaluating a plurality of binary-weighted delays provided by a corresponding plurality of delay chain units within a delay chain that is responsive to a reference clock signal. This evaluating step is performed to identify a first one of the plurality of delay chain units having a first delay in excess of a fraction of a period of the reference clock signal. A step is then performed to remove at least a second one of the plurality of delay chain units having a second delay in excess of the first delay from a delay path of the delay chain. This removal step facilitates efficient locking of the locked loop integrated circuit after a power-up or reset operation. Steps may also be performed to generate a compare signal that identifies a leading or lagging phase relationship between the reference clock signal and a feedback clock signal derived from an output of the delay chain. The locked loop integrated circuit is then locked by performing a progressive binary search operation using the value of the compare signal to control adjustments to the delay of the delay chain.

Other methods of operating a locked loop integrated circuit include generating a multi-bit signal that identifies a plurality of delay chain units within a binary-weighted digital delay line that provide a delay greater than one-half a period of a reference clock signal received at an input of the digital delay line. The delay of the binary-weighted digital delay line is then set to substantially match a delay of a smallest one of the identified plurality of delay chain units. These operations may be performed to set the delay line to a mid-point delay value, which supports efficient phase locking when the locked loop integrated circuit undergoes a power-up/reset operation.

DETAILED DESCRIPTION OF PREFERRED EMBODIMENTS

Figure 1B:
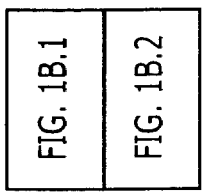
FIG. 1B is an electrical schematic of the phase comparator of FIG. 1A, according to embodiments of the present invention.

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The illustrated embodiments and multi-bit signals may also be scaled to handle clock signals that have lower or higher frequencies. The suffix B or prefix N to a signal name may also denote a complementary data or information signal or an active low control signal, for example. Furthermore, when a device, structure or element is identified as being responsive to an identified signal, it may be directly responsive to the identified signal (without change) or directly responsive to another signal derived from the identified signal.

Figure 1A:
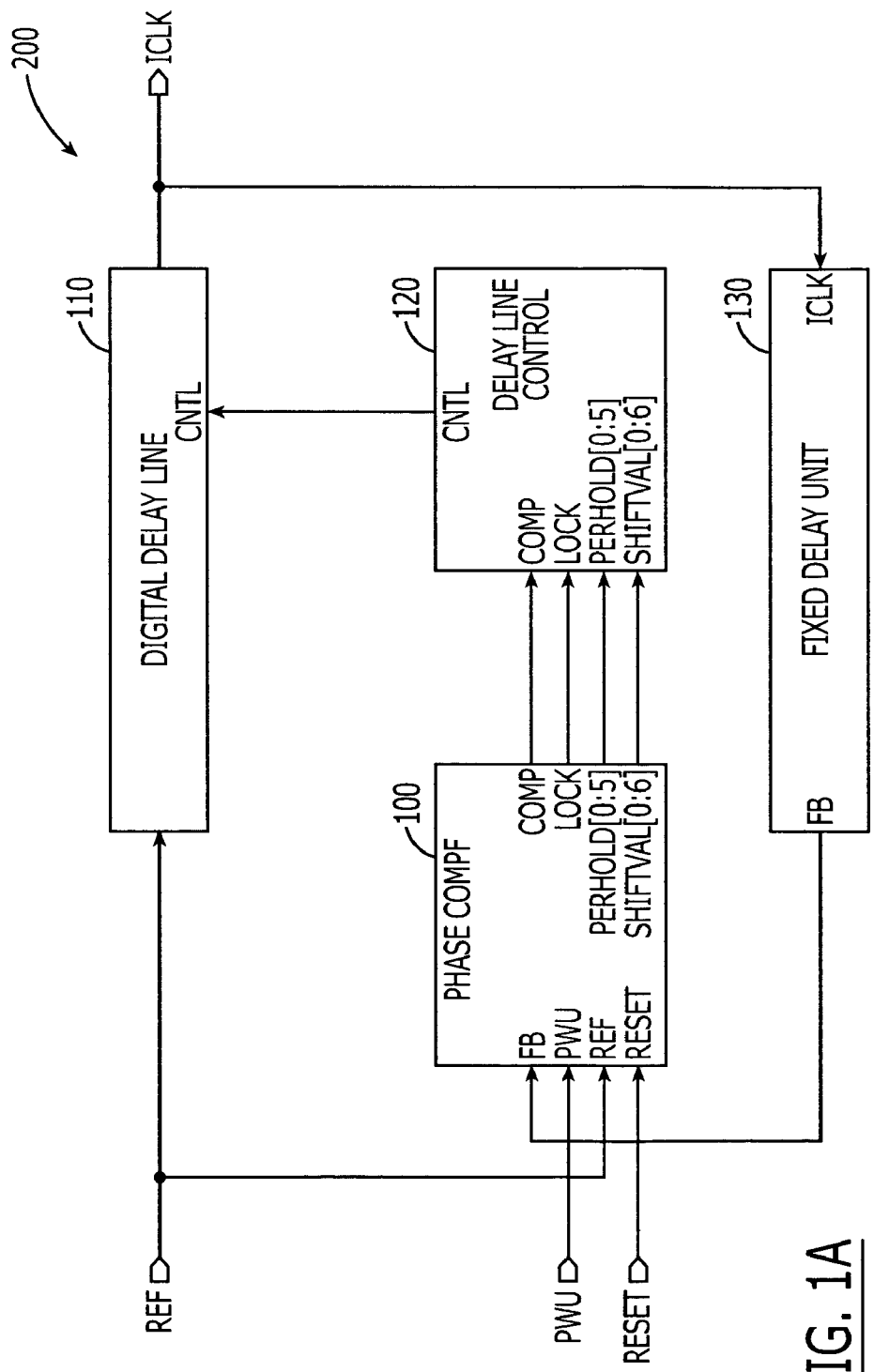
FIG. 1A is a block diagram of a delay-locked loop integrated circuit according to embodiments of the present invention.

Referring now to FIGS. 1A–1B, a delay-locked loop (DLL) integrated circuit 200 according to embodiments of the present invention will be described. The DLL integrated circuit 200 is illustrated as including a digital delay line 110 that is configured to generate an internal clock signal ICLK in response to a reference clock signal REF, which may have a non-unity duty cycle. The digital delay line 110 may comprise a plurality of delay units that collectively establish the total delay provided by the delay line 110. In some embodiments, the delay units (not shown) may provide a variable delay that is controlled by a value of a control signal (CNTL), which is generated by a delay line control circuit 120. In other embodiments, each of the delay units may provide a fixed delay, with the number of active delay units within the delay line 110 being controlled by the value of the control signal CNTL generated by the delay line control circuit 120. This control signal CNTL may be a multi-bit digital signal. Exemplary delay lines are illustrated and described in commonly assigned U.S. patent application Ser. Nos. 10/643,208, filed Aug. 18, 2003, and Ser. No. 10/663,624, filed Sep. 16, 2003, the disclosures of which are hereby incorporated herein by reference.

The DLL integrated circuit 200 is also illustrated as including a phase comparator 100, which is responsive to the reference clock signal REF and a feedback clock signal FB. The feedback clock signal FB typically represents a delayed version of the internal clock signal ICLK, with the degree of delay being provided by a fixed delay unit 130 that is configured to receive the internal clock signal ICLK. Based on this configuration of the DLL integrated circuit 200, the reference clock signal REF and the feedback clock signal FB will be in-phase with each other when a total delay provided by the digital delay line 110 and the fixed delay unit 130 equals an integer multiple of the period of the reference clock signal REF. The phase comparator 100 is also illustrated as being responsive to a power-up signal PWU and a reset signal RESET. When the power-up signal PWU is set to an active level (e.g., PWU=0), the DLL integrated circuit 200 is disposed in a power-up mode. During this mode, the DLL integrated circuit 200 forces all internal nodes within the digital delay line 110 to stable values to generate a stable feedback clock signal FB. As illustrated by FIG. 1B, the phase comparator 100 responds to an active power-up signal PWU by maintaining a first clock divider 20a in a reset mode while the feedback clock signal FB that drives the first clock divider 20a may be unstable. The reset signal RESET is an active high pulse that is used to reset a second clock divider 20b, which is responsive to the reference clock signal REF.

The phase comparator 100 is also illustrated as generating four output signals. These four output signals include the compare signal COMP, the lock signal LOCK, the period value signal PERHOLD[0:5] and the shift value signal SHIFTVAL[0:6]. The compare signal COMP operates to slow down FB relative to REF or speed up FB relative to REF. As described herein, when the compare signal COMP is set to a logic 1 value, the DLL integrated circuit 200 will operate to slow FB down, and when the compare signal COMP is set to a logic 0 value, the DLL integrated circuit 200 will operate to speed FB up. The lock signal LOCK specifies whether or not the reference and feedback clock signals REF and FB are in-phase. The period value signal PERHOLD[0:5], where PERHOLD[5] is the most significant bit, is the encoded size of one period (T) of the reference clock signal REF. The shift value signal SHIFTVAL[0:6] is the encoded value of the amount of delay that the DLL integrated circuit 200 must shift the feedback clock signal FB (in the direction indicated by the compare signal COMP) to lock FB in phase with REF.

The delay line control circuit 120 is responsive to the signals generated by the phase comparator 100. The delay line control circuit 120 is configured to adjust a value of the control signal CNTL upwards or downwards in response to the value of the compare signal COMP generated by the phase comparator 100. The magnitude of the initial adjustment that is made to the value of the control signal CNTL (after power-up) is typically controlled by the value of the shift value signal SHIFTVAL[0:6], with adjustments continuing thereafter, if necessary, until the lock signal LOCK indicates phase lock between REF and FB. The delay line control circuit 120 may be configured to adjust the value of the control signal CNTL so that the phase of the internal clock signal ICLK (and FB) jumps by a phase amount specified by the value of the shift value signal SHIFTVAL[0:6]. The delay line control circuit 120 may also operate to respond to the value of the period value signal PERHOLD[0:5] by generating additional control signals (not shown) that enable the DLL integrated circuit 200 to generate DLL phase delayed output signals for additional applications.

FIG. 1B illustrates an embodiment of the phase comparator 100 illustrated by FIG. 1A. The logic required to generate the period value signal PERHOLD[0:5] includes a pair of negative edge triggered D-type flip-flops (NET DFF) 10a and 10b, a positive edge triggered D-type flip-flop (PET DFF) 12a, a NOR gate 14 and a 6-bit counter 40a, which is also illustrated and described in U.S. Provisional Application Ser. No. 60/534,381, filed Jan. 5, 2004. Each of the D-type flip-flops includes a data input (D), a true output (Q)

and a complementary output (NQ). The three D-type flip-flops 10a, 10b and 12a collectively generate a three-bit period position signal PERPOS[0:2] and a three-bit not period position signal NPERPOS[0:2]. The NOR gate 14 generates a period time signal PERTIME in response to the signals PERPOS1 and NPERPOS0. The 6-bit counter 40a includes a clock input (CLKDBY3), an enable input (ENABLE), a not enable input (NENABLE), a 3-bit not position input NPOS[0:2] and a 3-bit position input POS[0:2]. The 6-bit counter 40a generates a 6-bit hold count signal HOLDCNT[0:5] and a 6-bit not hold count signal NHOLDCNT[0:5].

Figure 2:
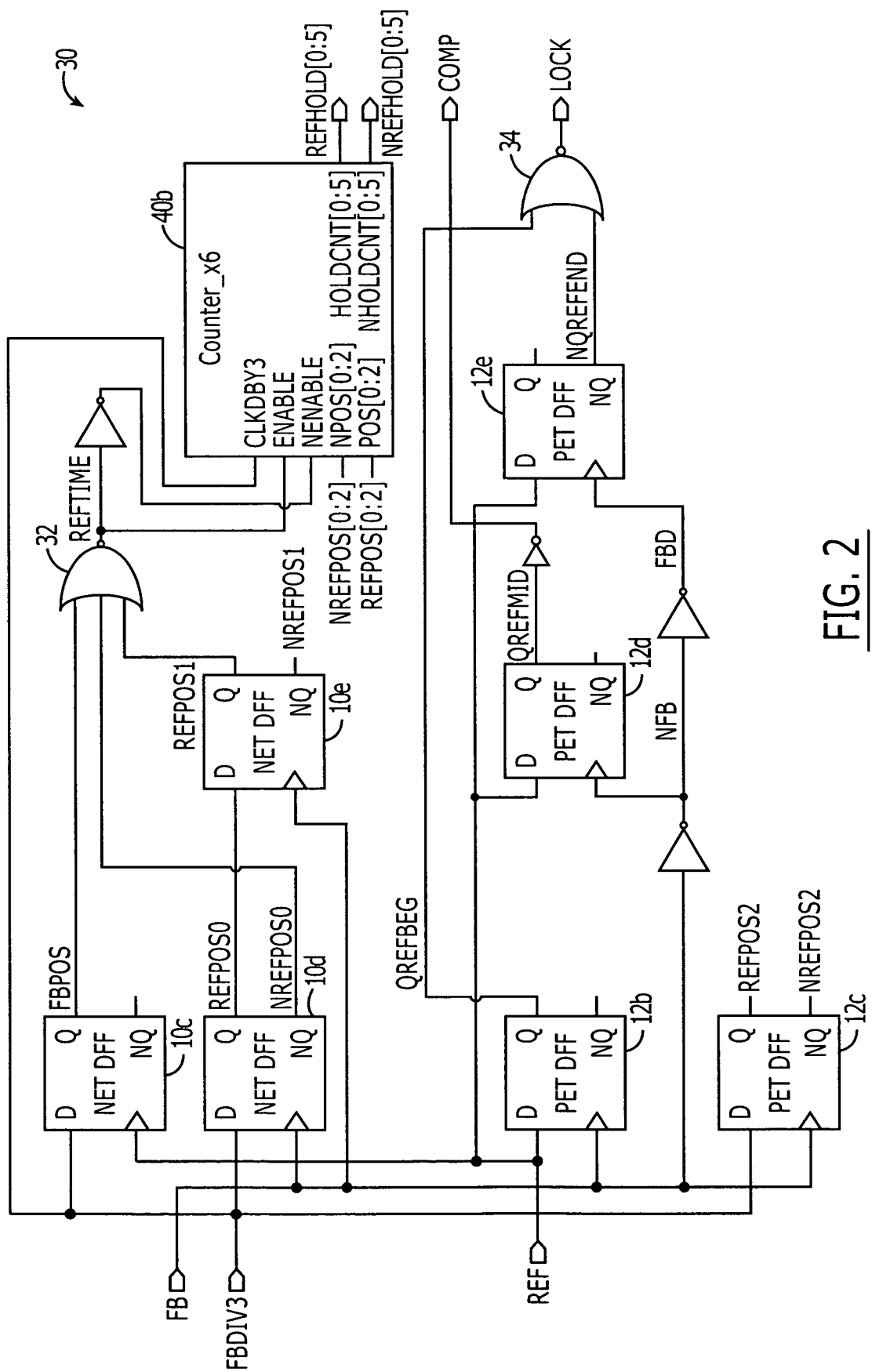
FIG. 2 is an electrical schematic of a phase half-comparator (phasecomphalf) illustrated by FIG. 1B.

The logic required to generate the compare signal COMP includes a pair of clock dividers 20a and 20b (i.e., divide-by-3 clock generators), which are synchronized with the feedback and reference clock signals FB and REF, respectively, and a pair of phase half-comparators 30a and 30b, which are illustrated in greater detail by FIG. 2. The first clock divider 20a generates the signal FBDIV3 at its output (CLKDIV3). The signal FBDIV3 is a periodic signal that is synchronized with the feedback clock signal FB and has a period that is three times a period of the feedback clock signal FB. The second clock divider 20b generates the signal REFDIV3 at its output (CLKDIV3). The signal REFDIV3 is a periodic signal that is synchronized with the reference clock signal REF and has a period that is three times a period of the reference clock signal REF. The combination of REF and REFDIV3 is used to count the amount of time from the falling edge of REF to the falling edge of FB. Each of the phase half-comparators 30a and 30b has three input terminals FB, FBDIV3 and REF and four output terminals COMP, LOCK, NREFHOLD[0:5] and REFHOLD[0:5]. As illustrated, the first phase half-comparator 30a generates the signals COMPREFTOFB, LOCKREFTOFB, and NREFHOLD[0:5] and the second phase half-comparator 30b generates the signals LOCKFBTOREF and FBHOLD[0:5].

A first AND-OR logic circuit 50a generates the compare signal COMP in response to the compare output COMP of the first phase half-comparator 30a, the complementary signals NUSECNTCMP (not use count compare) and USECNTCMP (use count compare) and a carry signal CAR5. When USECNTCMP equals zero and NUSECNTCMP equals one, the compare output COMP reflects the value of COMPREFTOFB. As described more fully herein, this means the rising edge of FB is simply used to capture the current value of REF when performing the compare operation. The output of the first AND-OR logic circuit 50a switches from a count compare method to an edge compare method when the count compare operation may become ambiguous (i.e., when REFHOLD[0:5]=FBHOLD[0:5]). The signals NUSECNTCMP and USECNTCMP are generated by the logic illustrated by FIG. 1B.2. This logic, which includes the NOR gates 22, 24 and 28 and NAND gate 26, is responsive to a multi-bit result signal RESULT[0:5], a most significant bit of a multi-bit period carry signal PERCAR[0:5] and a most significant bit of a multi-bit carry signal CAR[0:5]. When PERCAR[5] equals zero, the signal USECNTCMP switches low and the signal NUSECNTCMP switches high. When this happens, the phase comparator 100 uses a conventional phase comparison method (i.e., an edge comparison method) to generate the compare signal COMP because the period of the reference clock signal REF is too small for the preferred counting phase comparison method to be effective. In addition, the shift value signal SHIFTVAL[0:6] is also set to 1000000, which is the smallest delay value the DLL integrated circuit 200 can shift the feedback clock signal FB in time by. However, when the signal USECNTCMP is set high, then the shift value signal SHIFTVAL[0:6] is equal to the shortest phase difference between the rising edges of FB and REF.

The carry signal CAR[0:5] and the result signal RESULT[0:5] are generated by a second ripple carry adder 60b and the period carry signal PERCAR[0:5] is generated by a first ripple carry adder 60a. These ripple carry adders 60a and 60b include first and second comparand inputs IN0 and IN1 and a carry input CIN and generate a carry output COUT and a sum output SUM. The first and second ripple carry adders 60a and 60b are 6-bit adders, which are also illustrated and described in the aforementioned '381 application. The second ripple carry adder 60b is configured to operate as a subtractor that uses count comparisons to determine the shortest route to phase lock. In particular, the second ripple carry adder 60b operates to compare REFHOLD[0:5] to FBHOLD[0:5] and uses the conventional phase comparison method when these signals are equal. If they are not equal, the smaller value of the two becomes the smallest phase difference between FB and REF, which is reflected in the value of TERHOLD[0:5]. For example, if REFHOLD[0:5] equals 010000 and FBHOLD[0:5] equals 100000, then CAR5 will equal zero and TERHOLD[0:5] will equal 100000. Here, the DLL integrated circuit 200 will subtract the binary derivative of TERHOLD[0:5], BINHOLD[0:6], from FB in order to bring FB into phase with REF. If the counting phase comparison method described herein is unable to make LOCK equal to one after one DLL clock cycle, then the phase comparator 100 will resort to the conventional phase comparison method (e.g., edge comparison method) and require one more DLL clock cycle to cause a lock condition (LOCK=1).

The lock signal LOCK is generated by logically ORing the pair of lock signals generated by the phase half-comparators 30a and 30b, which are shown as LOCKREFTOFB and LOCKFBTOREF. Operations to generate these lock signals will be described more fully hereinbelow with reference to FIGS. 3A–3C.

As illustrated by FIG. 1B.2, the shift value signal SHIFTVAL[0:6] is generated by a x7 AND-OR logic circuit 50b. Like the first AND-OR logic circuit 50a, the output of the x7 AND-OR logic circuit 50b switches from a count compare operation to an edge compare operation when the count compare operation may become ambiguous (i.e., when REFHOLD[0:5]=FBHOLD[0:5]). The 7-bit signal BINHOLD[0:6], which is provided to the AND-OR logic circuit 50b, is generated at the output of a ternary-to-binary converter 70, which is responsive to a 6-bit ternary hold signal TERHOLD[0:5]. This ternary-to-binary converter 70 takes bits that have absolute weights of $3 \times 2^n$ and converts them to bits that have absolute weights of $2^n$. The ternary hold signal TERHOLD[0:5] is generated by a x6 AND-OR logic circuit 50c, which is responsive to the 6-bit reference hold signal REFHOLD[0:5], the carry signal CAR5 and the feedback hold signal FBHOLD[0:5]. The reference hold signal REFHOLD[0:5] is generated by the first phase half-comparator 30a and the feedback hold signal FBHOLD[0:5] is generated by the second phase half-comparator 30b.

Referring now to FIG. 2, a phase half-comparator 30 is illustrated as including three NET DFFs 10c–10e, four PET DFFs 12b–12e, a pair of NOR gates 32 and 34 and a 6-bit counter 40b. The NET DFF 10c receives the FBDIV3 signal at its data input D and generates a feedback position signal FBPOS. The NET DFF 10d receives the FBDIV3 signal at its data input D and generates the reference position 0 signal REFPOS0 and the not reference position 0 signal NREF- POSO. The NET DFF 10e receives the REFPOS0 signal at its data input D and generates the reference position 1 signal REFPOS1 and the not reference position 1 signal NREFPOS1. The NOR gate 32 generates a reference time signal REFTIME in response to FBPOS, NREFPOS0 and REFPOS1.

When this reference time signal REFTIME is active at a high level, the 6-bit counter 40b is enabled to perform count operations. The PET DFF 12b receives the reference clock signal REF at its data input D and generates a reference beginning signal QREFBEG. The PET DFF 12c receives the FBDIV3 signal at its data input D and generates the reference position 2 signal REFPOS2 at its true output Q and the not reference position 2 signal NREFPOS2 at its complementary output NQ. The PET DFF 12d is synchronized with the signal NFB, which is an inverted version of the feedback clock signal FB. The PET DFF 12d receives the reference clock signal REF at its data input D and generates a reference midpoint signal QREFMID. An inverted version of this reference midpoint signal QREFMID operates as the compare signal COMP for the phase half-comparator 30. The PET DFF 12e receives the reference clock signal REF at its data input D and generates the not reference end signal NQREFEND at its complementary output NQ. The PET DFF 12e is synchronized with a delayed feedback clock signal FBD. The NOR gate 34 generates a lock signal LOCK for the phase half-comparator 30. This NOR gate 34 is responsive to the reference beginning signal QREFBEG and the not reference end signal NQREFEND. The 6-bit counter 40b generates the 6-bit reference hold signal REFHOLD[0:5] and the 6-bit not reference hold NREFHOLD signal NREFHOLD[0:5] for the phase half-comparator 30. The timing of the above-described signals FBDIV3, FB, REF, REFTIME, REFPOS[0:2] and FBPOS within the phase half-comparator 30 are also illustrated by FIG. 13 of the aforementioned '318 application.

Referring again to FIG. 1B, the phase comparator 100 is illustrated as being responsive to first and second periodic signals (REF and FB) which may have equivalent non-unity duty cycle ratios. The phase comparator 100 generates a compare signal COMP that identifies a direction the feedback clock signal FB should be shifted in time to bring it into alignment with the reference clock signal REF. This compare signal COMP is generated by comparing a first degree to which the reference clock signal REF leads the feedback clock signal FB to a second degree to which the reference clock signal REF lags the feedback clock signal FB. These comparison operations are performed by the logic associated with the first and second clock dividers 20a and 20b, the first and second phase half-comparators 30a and 30b, the first AND-OR logic circuit 50a, the first and second ripple carry adders 60a and 60b and the logic used to generate the complementary signals NUSECNTCMP and USECNTCMP. The phase comparator 100 determines a smaller of the first and second degrees and sets the compare signal COMP of FIG. 1A to a value that results in a speed-up of the feedback clock signal FB when the first degree is determined to be less than the second degree. Alternatively, the compare signal COMP is set at a value that results in a slow-down of the feedback clock signal FB when the second degree is determined to be less than the first degree. According to preferred aspects of the DLL integrated circuit 100, the delay line control circuit 120 may respond to the shift value signal SHIFTVAL[0:6] by adjusting the value of the control signal CNTL in a single cycle so that the phase of the feedback clock signal FB jumps by an amount sufficient to almost immediately place it into at least close alignment with the reference clock signal REF.

As illustrated by the NOR gate 16, the lock signal LOCK illustrated in FIG. 1B.1 is generated by logically ORing a first lock signal (LOCKREFTOFB), which specifies whether a leading edge of the reference clock signal REF is within a first time window (e.g., a 200 ps time window) relative to a leading edge of the feedback clock signal FB, and a second lock signal (LOCKFBTOREF), which specifies whether the leading edge of the feedback clock signal FB is within a second time window (e.g., 200 ps time window) relative to the leading edge of the reference clock signal REF.

Figure 3A:
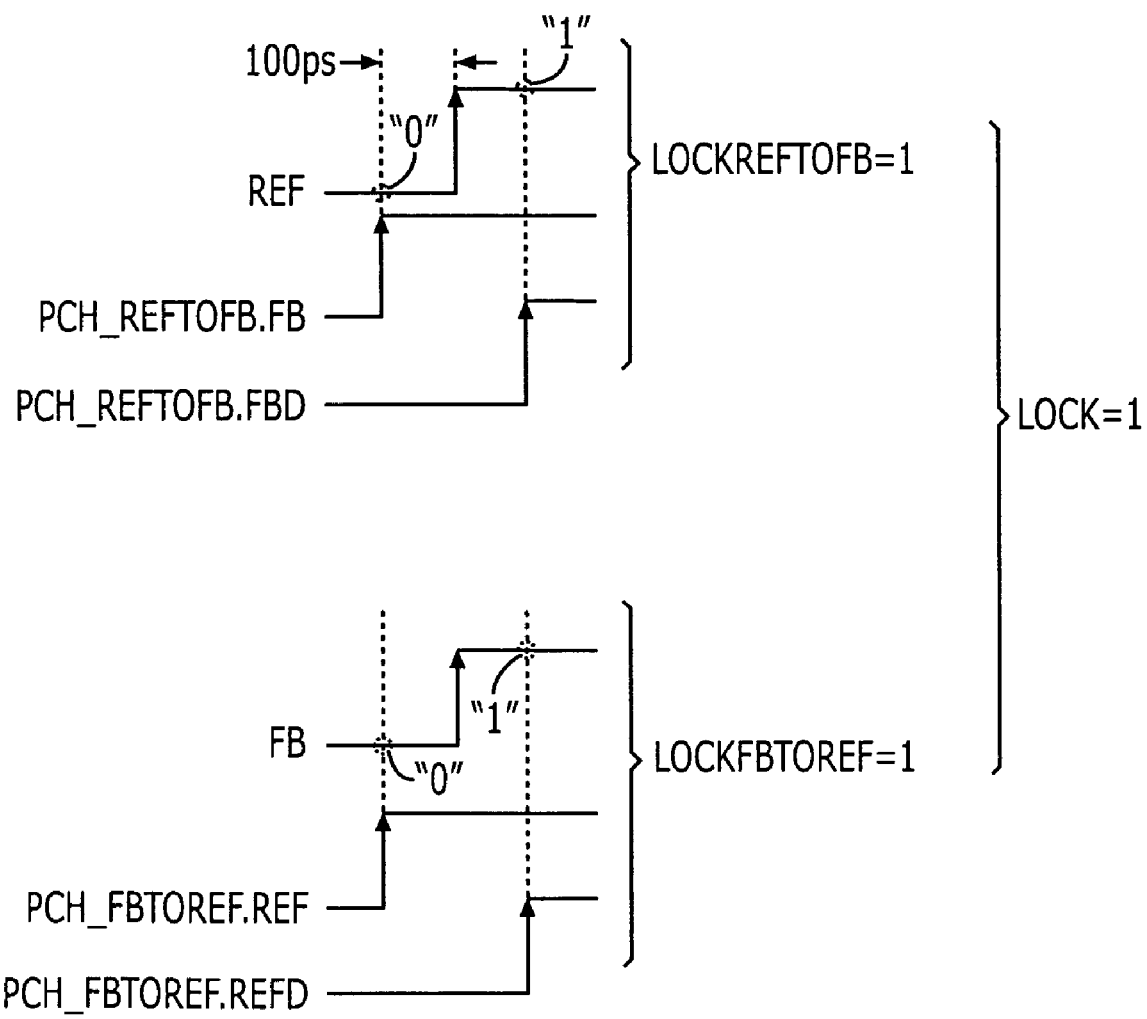
FIGS. 3A–3C are timing diagrams that illustrate various cases for generating the lock signal LOCK illustrated by FIG. 1B.
Figure 3B:
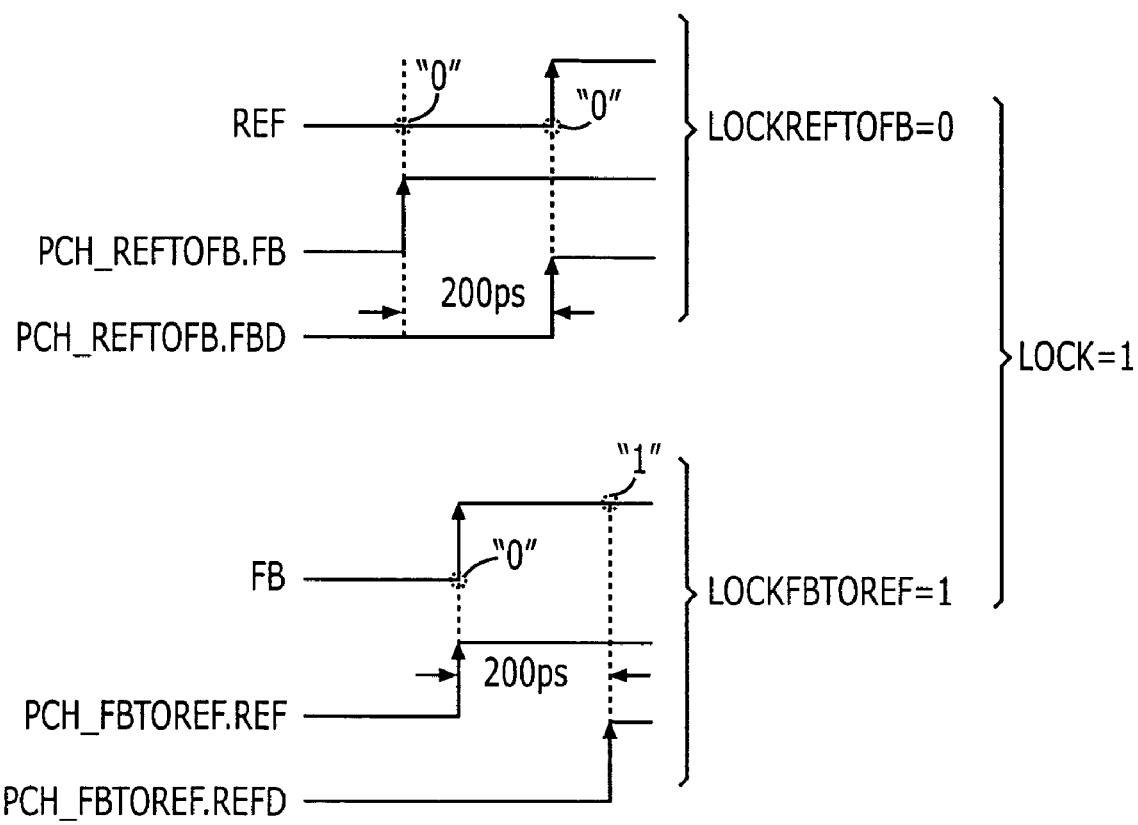
Figure 3C:
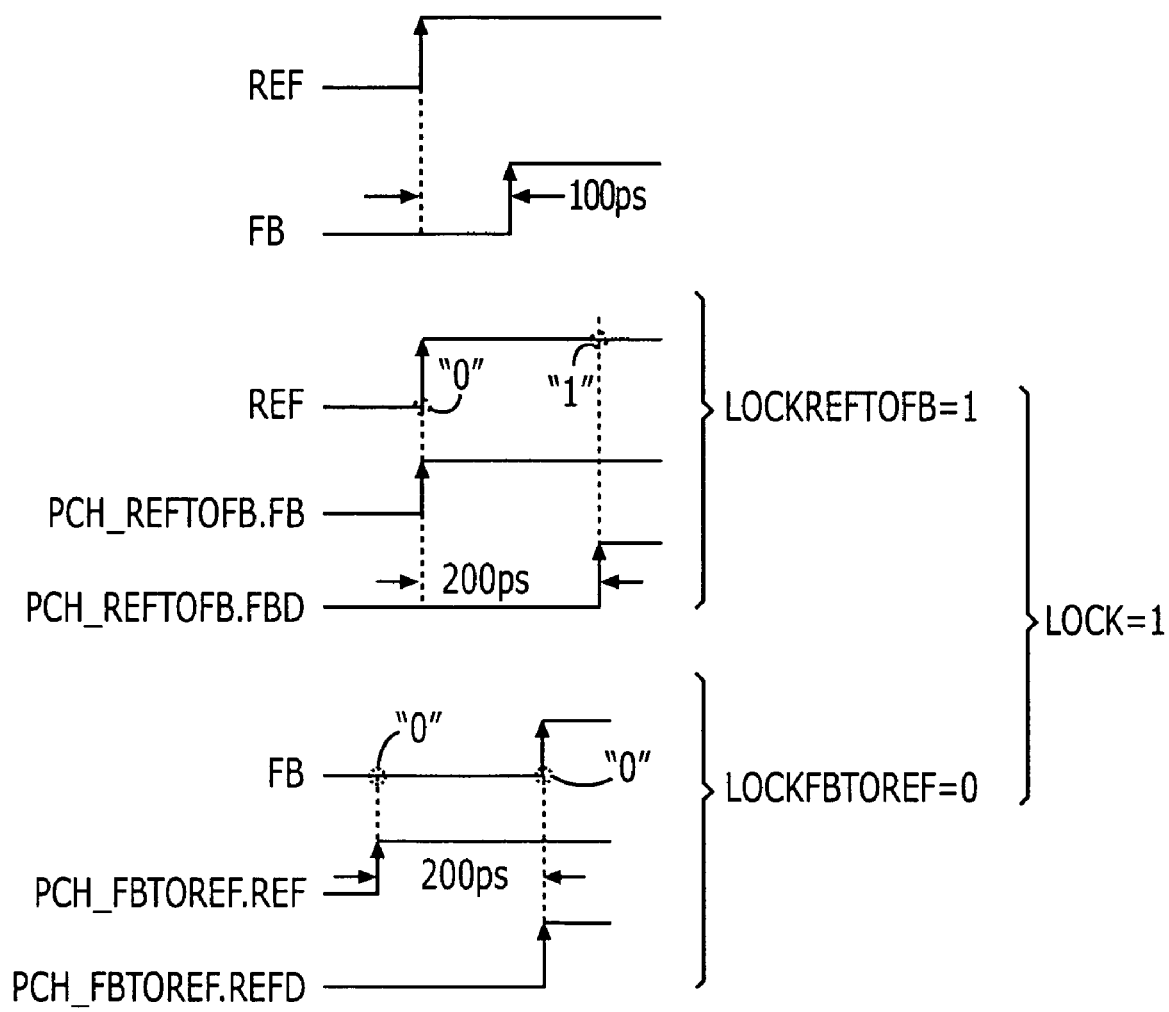

These operations to generate the first lock signal LOCKREFTOFB at an output of the first phase half-comparator 30a and generate the second lock signal LOCKFBTOREF at an output of the second phase half-comparator 30b are illustrated by the timing diagrams of FIGS. 3A–3C. In particular, FIG. 3A illustrates an ideal case when the reference and feedback clock signals REF and FB are aligned with each other. Under this ideal timing condition, the first and second phase half-comparators 30a and 30b operate to identify whether or not the phases of the reference and feedback clock signals are sufficiently aligned to constitute a lock condition. In this example, a ±100 ps phase difference between the leading edges of the reference and feedback clock signals represents a lock condition. The determination of this lock condition occurs under two timing scenarios illustrated by FIG. 3A. Under the first timing scenario, accelerated and delayed versions of the feedback clock signal FB are used to capture the state of the reference clock signal REF as "0" and "1", respectively. These operations are performed within the first phase half-comparator 30a, with the reference clock signal REF being provided as a data input to the flip-flops 12b, 12d and 12e. If the nominal delay provided by an inverter equals 100 ps, then the delayed feedback clock signal FBD, which is provided to the clock input of PET DFF 12e, will be delayed by 200 ps relative to the clock input of PET DFF 12b, which receives the feedback clock signal FB. The clock signals provided to these two clock inputs are illustrated as PCH_REFTOFB.FB and PCH_REFTOFB.FBD in FIG. 3A, and the first lock signal LOCKREFTOFB is generated at the output of the NOR gate 34. Under the second timing scenario, accelerated and delayed versions of the reference clock signal REF are used to capture the state of the feedback clock signal FB as "0" and "1", respectively. These operations are performed within the second phase half-comparator 30b, with the feedback clock signal FB being provided as a data input to the flip-flops 12b, 12d and 12e. The clock signals provided to the clock inputs of flip-flop 12b and 12e are illustrated as PCH_FBTOREF.REF and PCH_FBTOREF.REFD, respectively, in FIG. 3A. The second lock signal LOCKFBTOREF is generated at the output of the NOR gate 34. Accordingly, under this ideal timing condition, both the first and second lock signals LOCKREFTOFB and LOCKFBTOREF will be generated at logic 1 values and passed to an output of the phase comparator 100 as a LOCK signal having an active high level.

FIG. 3B illustrates a first extreme case when the feedback clock signal FB leads the reference clock signal REF by 100 ps. Under this extreme case, the first and second phase half-comparators 30a and 30b operate to identify whether or not the phases of the reference and feedback clock signals are sufficiently aligned to constitute a lock condition. The determination of this lock condition occurs under two timing scenarios illustrated by FIG. 3B. Under the first timing scenario, accelerated and delayed versions of the feedback clock signal FB are used to capture the state of the reference clock signal REF as "0" and "0", respectively. These operations are performed within the first phase half-comparator 30a, with the reference clock signal REF being provided as a data input to the flip-flops 12b, 12d and 12e. The clock signals provided to the clock inputs of flip-flops 12b and 12e are illustrated as PCH_REFTOFB.FB and PCH_REFTOFB.FBD, respectively, and the first lock signal LOCKREFTOFB is generated as a logic 0 signal, which indicates a failure to detect a lock condition. Under the second timing scenario, accelerated and delayed versions of the reference clock signal REF are used to capture the state of the feedback clock signal FB as "0" and "1", respectively. These operations are performed within the second phase half-comparator 30b, with the feedback clock signal FB being provided as a data input to the flip-flops 12b, 12d and 12e. The clock signals provided to the clock inputs of flip-flop 12b and 12e are illustrated as PCH_FBTOREF.REF and PCH_FBTOREF.REFD, respectively, in FIG. 3B. The second lock signal LOCKFBTOREF is generated as a logic 1 signal to indicate a lock condition. Accordingly, under this first extreme case, the second lock signal LOCKFBTOREF will be generated at a logic 1 value and passed to an output of the phase comparator 100 as a LOCK signal having an active high level.

FIG. 3C illustrates a second extreme case when the feedback clock signal FB lags the reference clock signal REF by 100 ps. Under this extreme case, the first and second phase half-comparators 30a and 30b operate to identify whether or not the phases of the reference and feedback clock signals are sufficiently aligned to constitute a lock condition. The determination of this lock condition occurs under two timing scenarios illustrated by FIG. 3C. Under the first timing scenario, accelerated and delayed versions of the feedback clock signal FB are used to capture the state of the reference clock signal REF as "0" and "1", respectively. These operations are performed within the first phase half-comparator 30a, with the reference clock signal REF being provided as a data input to the flip-flops 12b, 12d and 12e. The clock signals provided to the clock inputs of flip-flops 12b and 12e are illustrated as PCH_REFTOFB.FB and PCH_REFTOFB.FBD, respectively, and the first lock signal LOCKREFTOFB is generated as a logic 1 signal, which indicates a lock condition. Under the second timing scenario, accelerated and delayed versions of the reference clock signal REF are used to capture the state of the feedback clock signal FB as "0" and "0", respectively. These operations are performed within the second phase half-comparator 30b, with the feedback clock signal FB being provided as a data input to the flip-flops 12b, 12d and 12e. The clock signals provided to the clock inputs of flip-flop 12b and 12e are illustrated as PCH_FBTOREF.REF and PCH_FBTOREF.REFD, respectively, in FIG. 3C. The second lock signal LOCKFBTOREF is generated as a logic 0 signal, which indicates a failure to detect a lock condition. Accordingly, under this second extreme case, the first lock signal LOCKREFTOFB will be generated at a logic 1 value and passed to an output of the phase comparator 100 as a LOCK signal having an active high level.

Figure 4A:
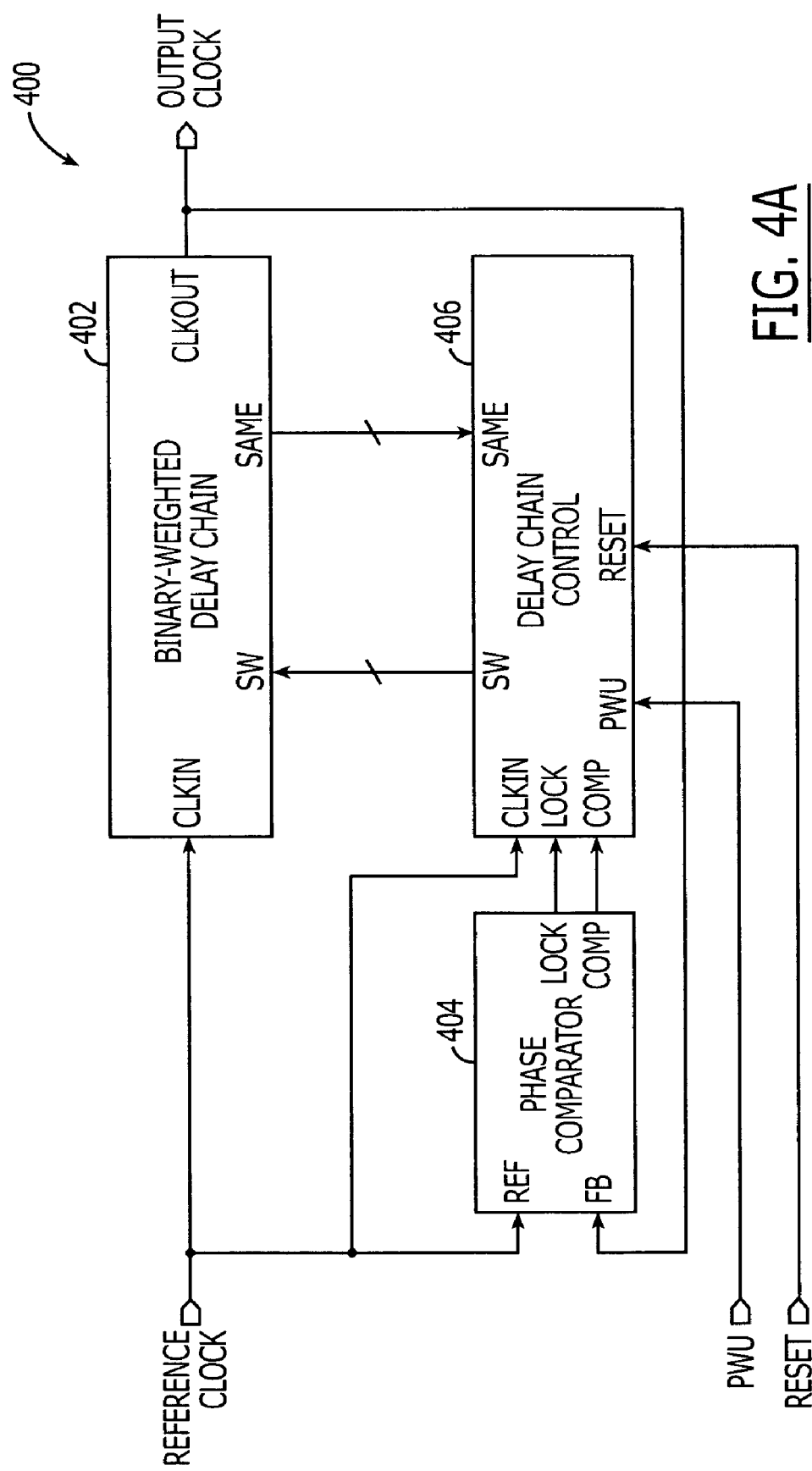
FIG. 4A is a block diagram of a delay-locked loop integrated circuit according to embodiments of the present invention.

Referring now to FIG. 4A, a delay-locked loop integrated circuit 400 according to another embodiment of the present invention includes a delay chain 402, a phase comparator 404 and a delay chain control circuit 406, connected as illustrated. The delay chain 402 is illustrated as a binary-weighted delay chain 402 that is configured to receive a periodic signal to be delayed. The delay chain 402 includes a plurality of delay chain units (DCUs), such as those illustrated in more detail in FIGS. 5A–5C. The delay chain control circuit 406 may include a control circuit 502, a buffer register 504, an adder/subtractor 506, a priority encoder 508, a shift register 510, a delay line decoder 512 and a clock generator/selector circuit 514, as illustrated by FIG. 5E.

The periodic signal is illustrated as a reference clock signal that is received at an input (CLKIN) of the delay chain 402 and also received at a first input (REF) of the phase comparator 404. The output (CLKOUT) of the delay chain 402 is configured to generate a delayed version of the periodic signal received at the input of the delay chain 402. In particular, the delay chain 402 is illustrated as generating an output clock signal, which may be provided to circuit elements (not shown) on an integrated circuit chip. The output clock signal (or a delayed version thereof) may also be used as a feedback clock signal. This feedback clock signal is provided to a second input (FB) of the phase comparator 404. Although not shown, the signal path from the output (CLKOUT) of the delay chain 402 to the second input (FB) of the phase comparator 404 may also include a fixed delay device (e.g., fixed delay line), which adds an additional delay to the periodic signal generated at the output of the delay chain 402.

The phase comparator 404 is illustrated as generating a compare signal (COMP) and a lock signal (LOCK). The compare signal COMP is configured to identify a leading or lagging relationship between the reference clock signal and the feedback clock signal. The lock signal LOCK is configured to indicate whether the reference and feedback clock signals are sufficiently close in phase to be considered phase-locked to each other. The delay chain control circuit 406 is configured to receive the reference clock signal and the lock and compare signals generated by the phase comparator 404. The delay chain control circuit is also configured to receive a power-up signal (PWU), which is active during a power-up time interval and thereafter inactive, and a reset signal (RESET), which may be used to simply reset a clock generator/selector located internal to the delay chain control circuit 406. In some embodiments, the reset signal RESET may also perform operations similar to the power-up signal.

Figure 4B:
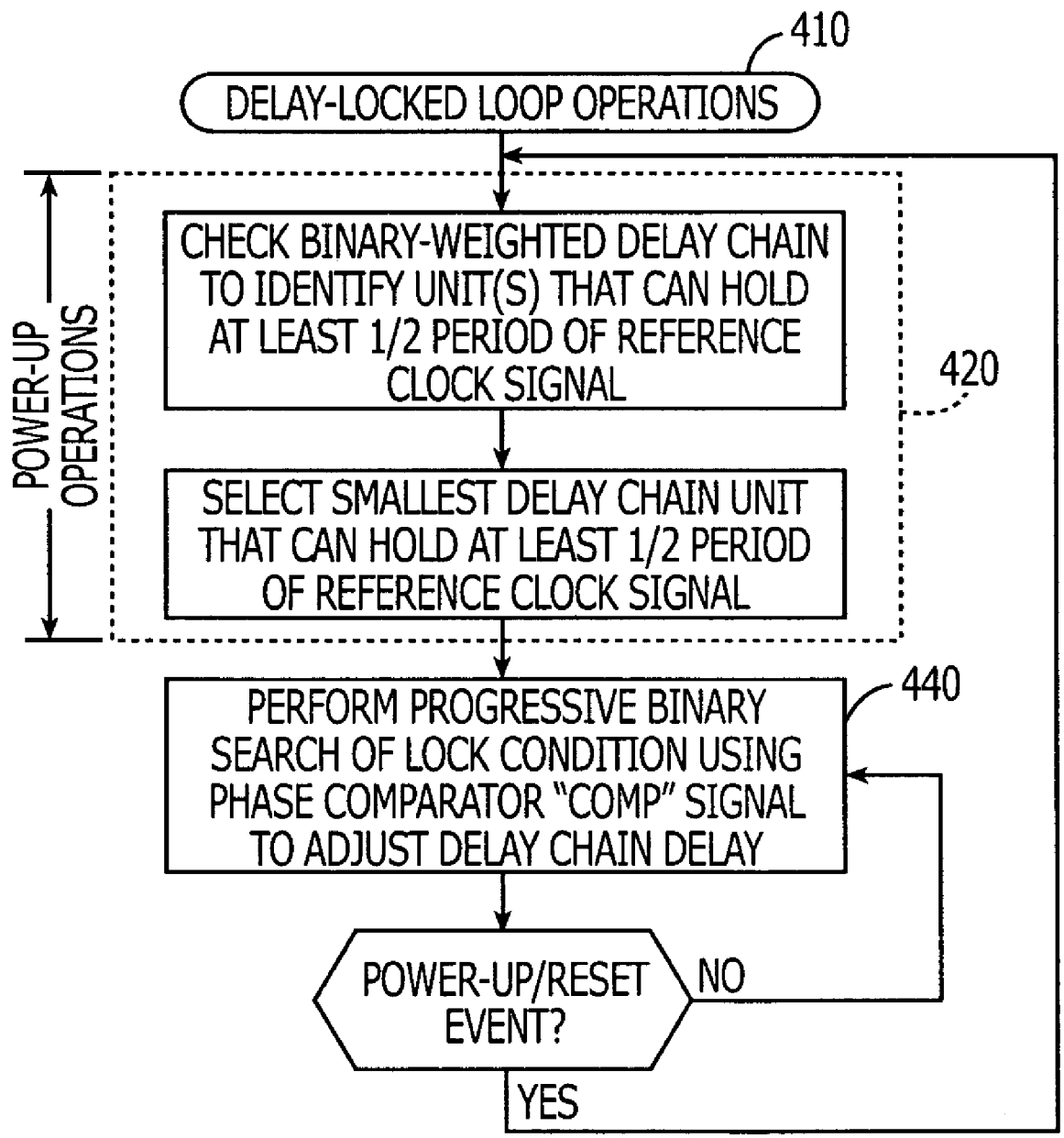
FIG. 4B is a flow diagram of operations that illustrate methods of operating delay-locked loop integrated circuits according to embodiments of the present invention.

As illustrated by FIG. 4B, operations 410 performed by the delay-locked loop integrated circuit 400 of FIG. 4A include power-up operations, Block 420, and search operations, Block 440. The power-up operations 420 are illustrated as including an operation to check the binary-weighted delay chain 402 to identify at least one delay chain unit that can hold a desired fraction of a period of a reference clock signal, which is provided to an input of the delay chain 402. This desired fraction of the period is preferably set at a value of one-half the period of the reference clock signal, however, other fractions of the period can also be identified. As described more fully hereinbelow, the smallest of the identified delay chain units is then selected by enabling its delay path within the delay chain 402 and enabling the bypass paths within the remaining delay chain units within the delay chain 402. This selection operation causes the delay chain 402 to provide a total delay equivalent to about the delay of the selected delay chain unit. This total delay represents a starting point for the search operations illustrated by Block 440, which occur after the power-up operations are complete.

As illustrated by Block 440, the power-up operations are followed by a progressive binary search operation to achieve a lock condition within the delay-locked loop integrated circuit 400. In particular, the compare signal COMP generated by the phase comparator 404 is used by the delay chain control circuit 406 to adjust (+ or −) the amount of delay provided by the delay chain 402. Once the phases of the reference clock signal and the feedback clock signal (e.g., output clock signal) are sufficiently close, the phase comparator 404 will generate an active lock signal LOCK, which operates to suspend further adjustments to the delay of the delay chain 402 until the active state of the lock signal LOCK is removed. The operations illustrated by Block 440 continue until a next power-down/power-up event occurs.

Figure 4C:
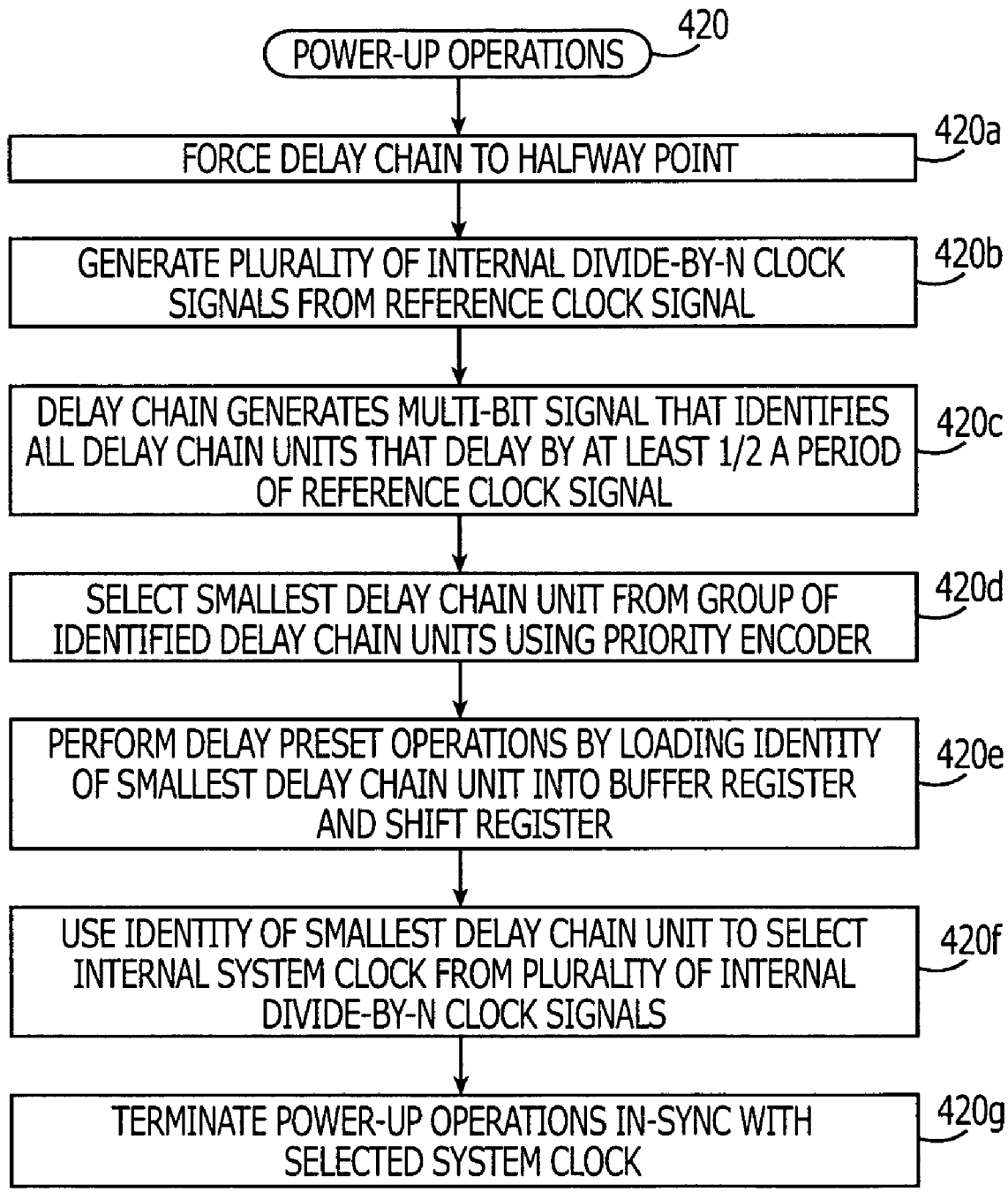
FIG. 4C is a flow diagram of operations that illustrate methods of operating delay-locked loop integrated circuits during the power-up operations illustrated by FIG. 4B.
Figure 4D:
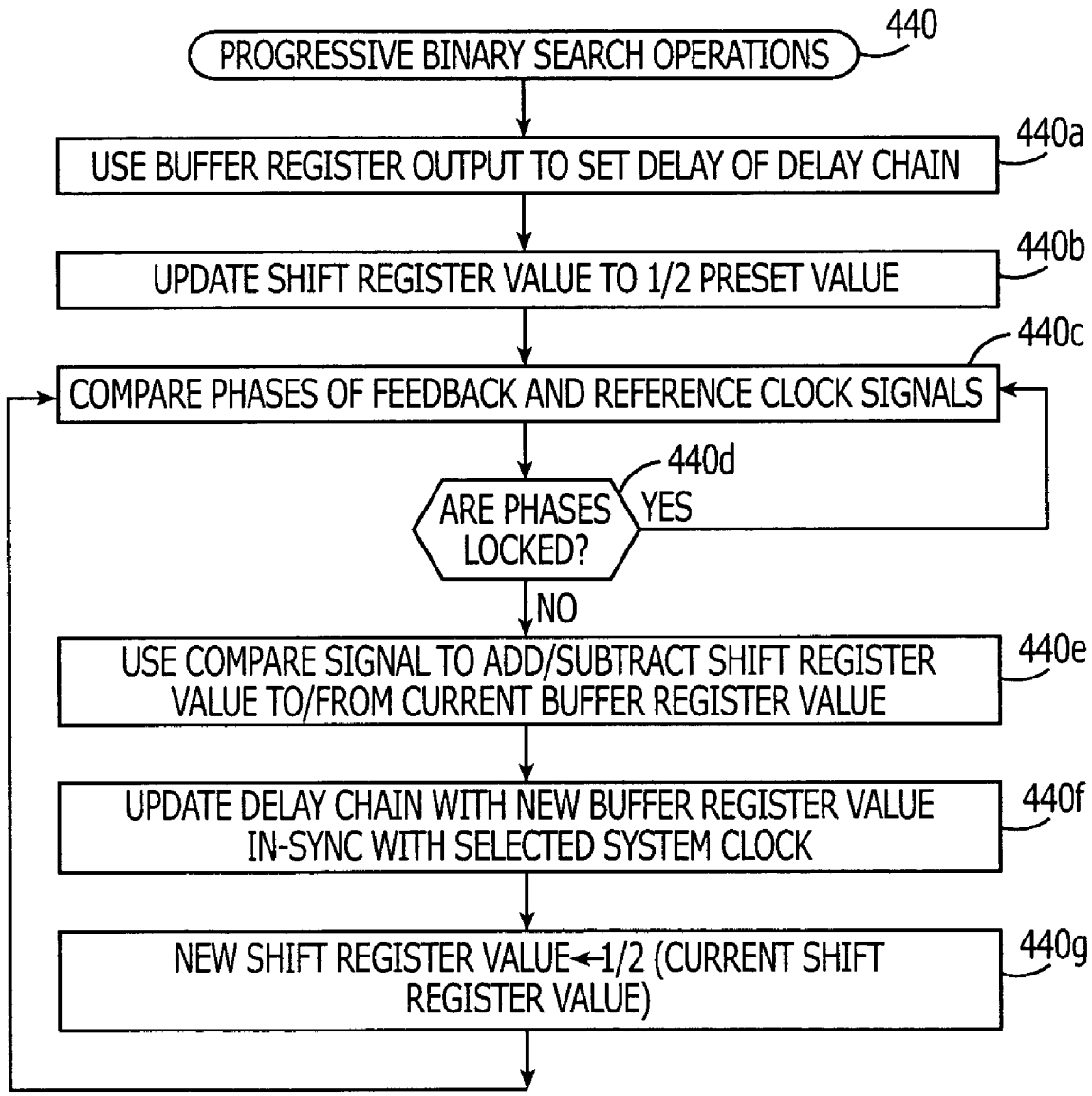
FIG. 4D is a flow diagram of operations that illustrate methods of performing binary search operations to achieve a lock condition in the delay-locked loop integrated circuit of FIG. 4A, according to embodiments of the present invention.
Figure 5A:
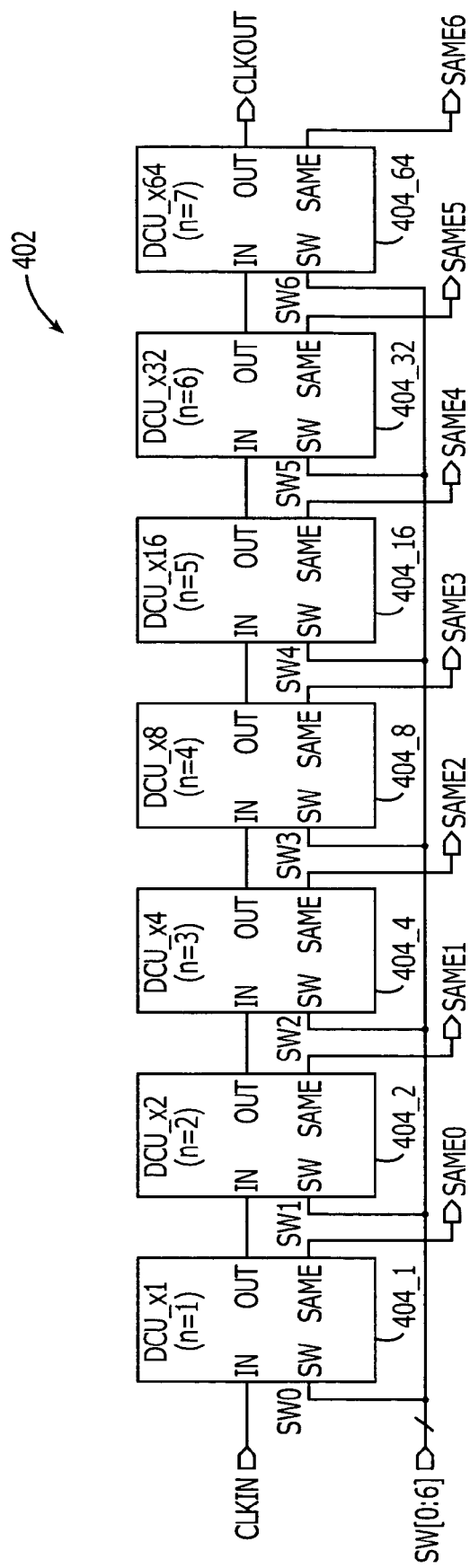
FIG. 5A is a block diagram of a binary-weighted delay chain, according to embodiments of the present invention.
Figure 5B:
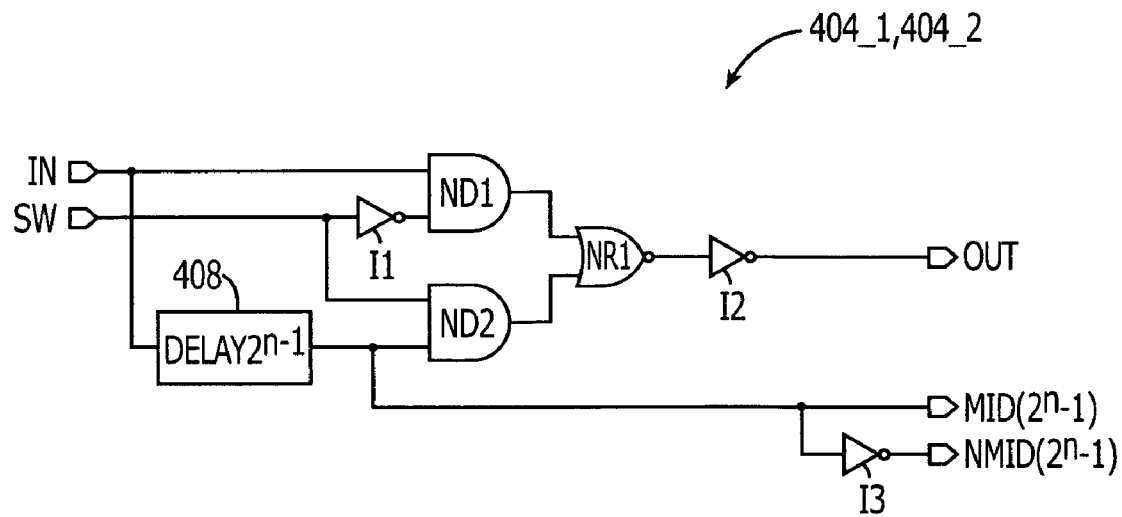
FIG. 5B is an electrical schematic of a first delay chain unit that may be used in the delay chain of FIG. 5A.
Figure 5B:
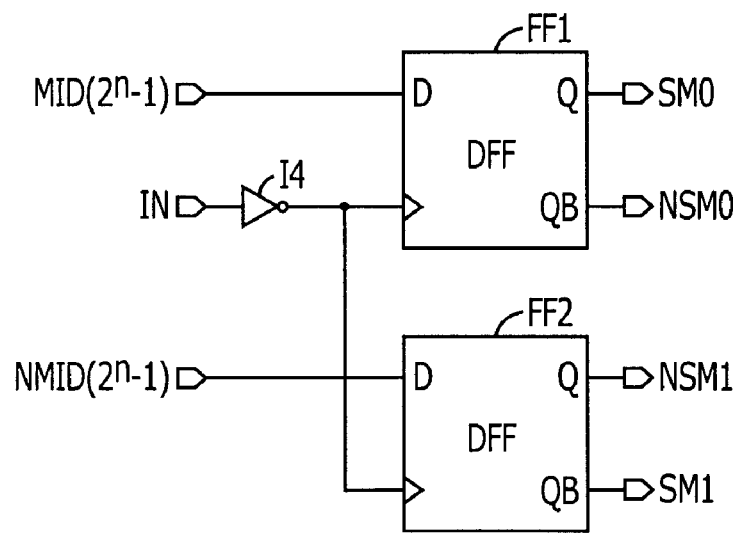
Figure 5B:
Figure 5C:
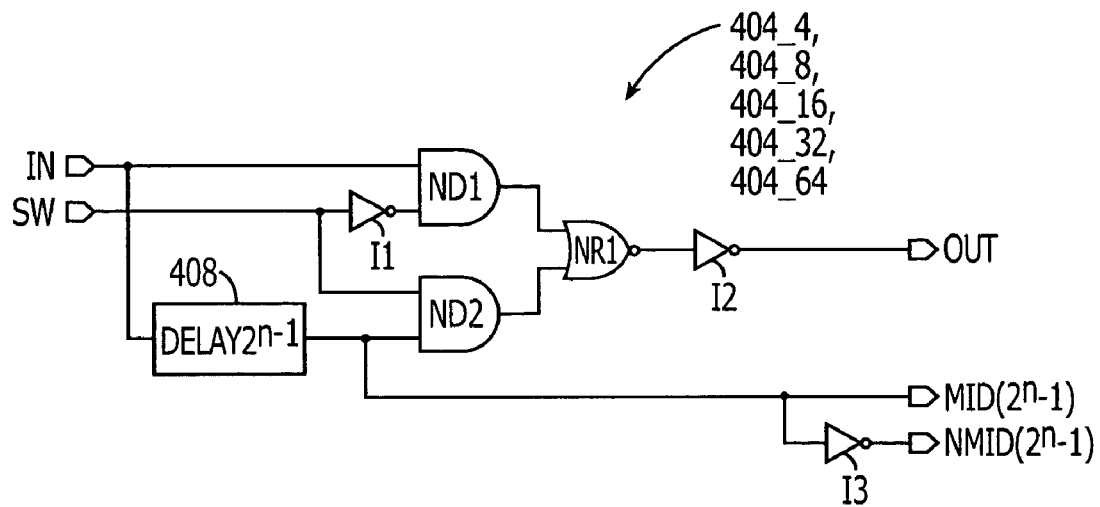
FIG. 5C is an electrical schematic of a second delay chain unit that may be used in the delay chain of FIG. 5B.
Figure 5C:
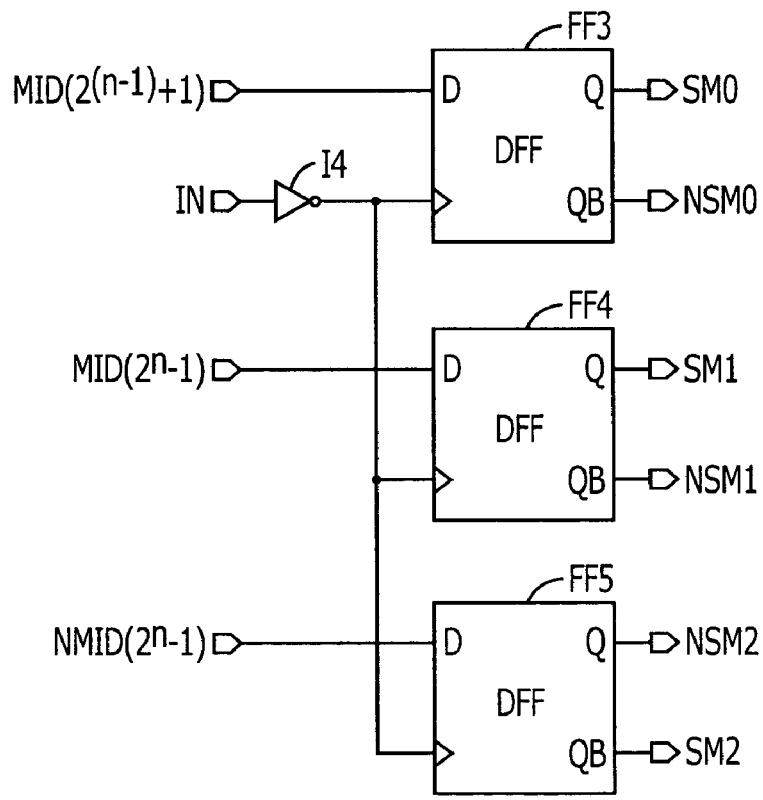
Figure 5C:
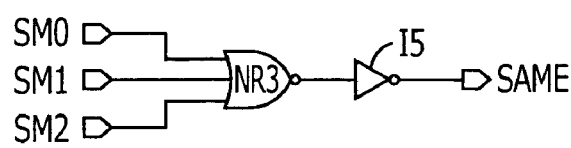
Figure 5D:
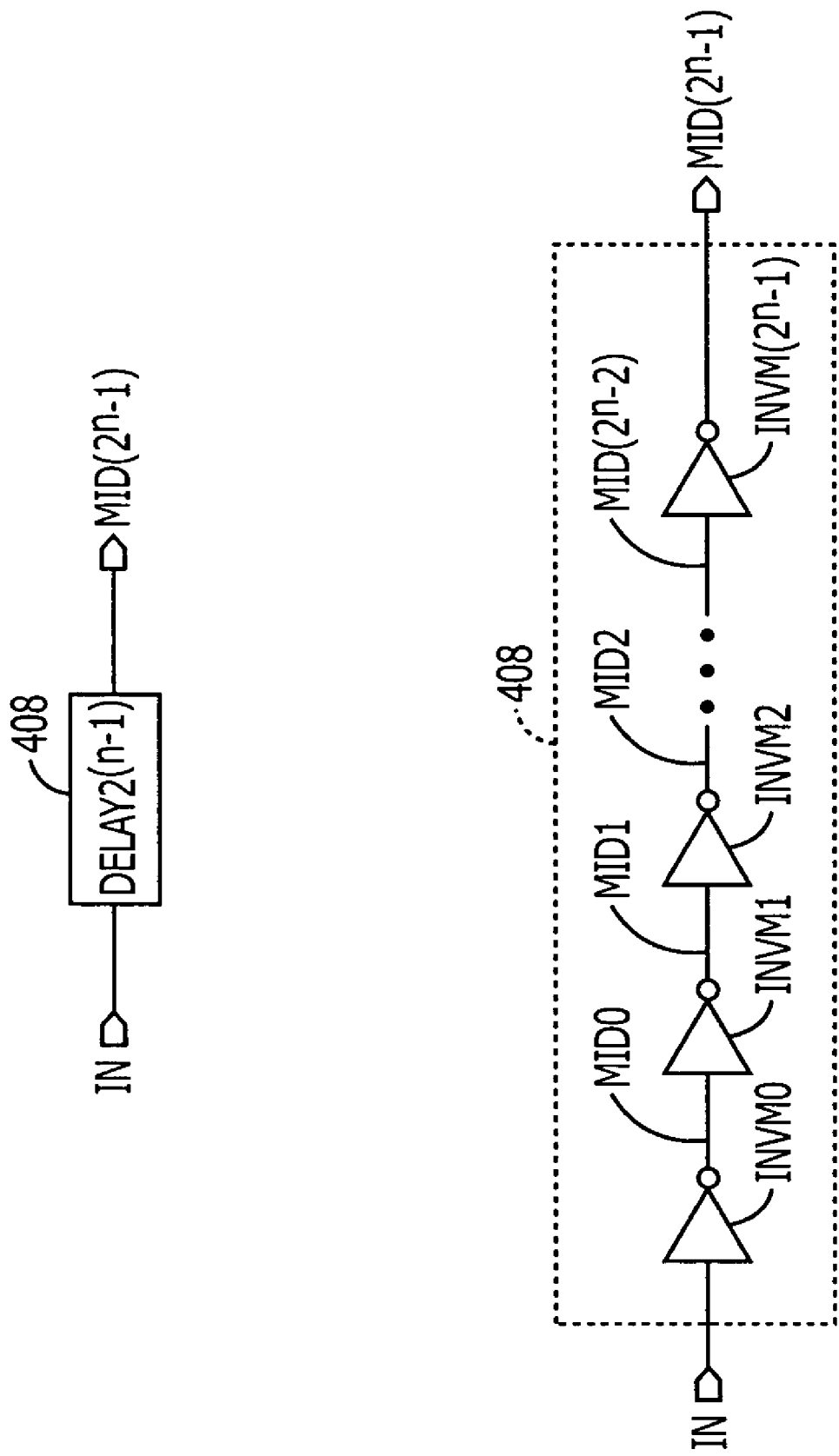
FIG. 5D illustrates a configuration of a delay element that may be used in the delay chain units of FIGS. 5B–5C.
Figure 5E:
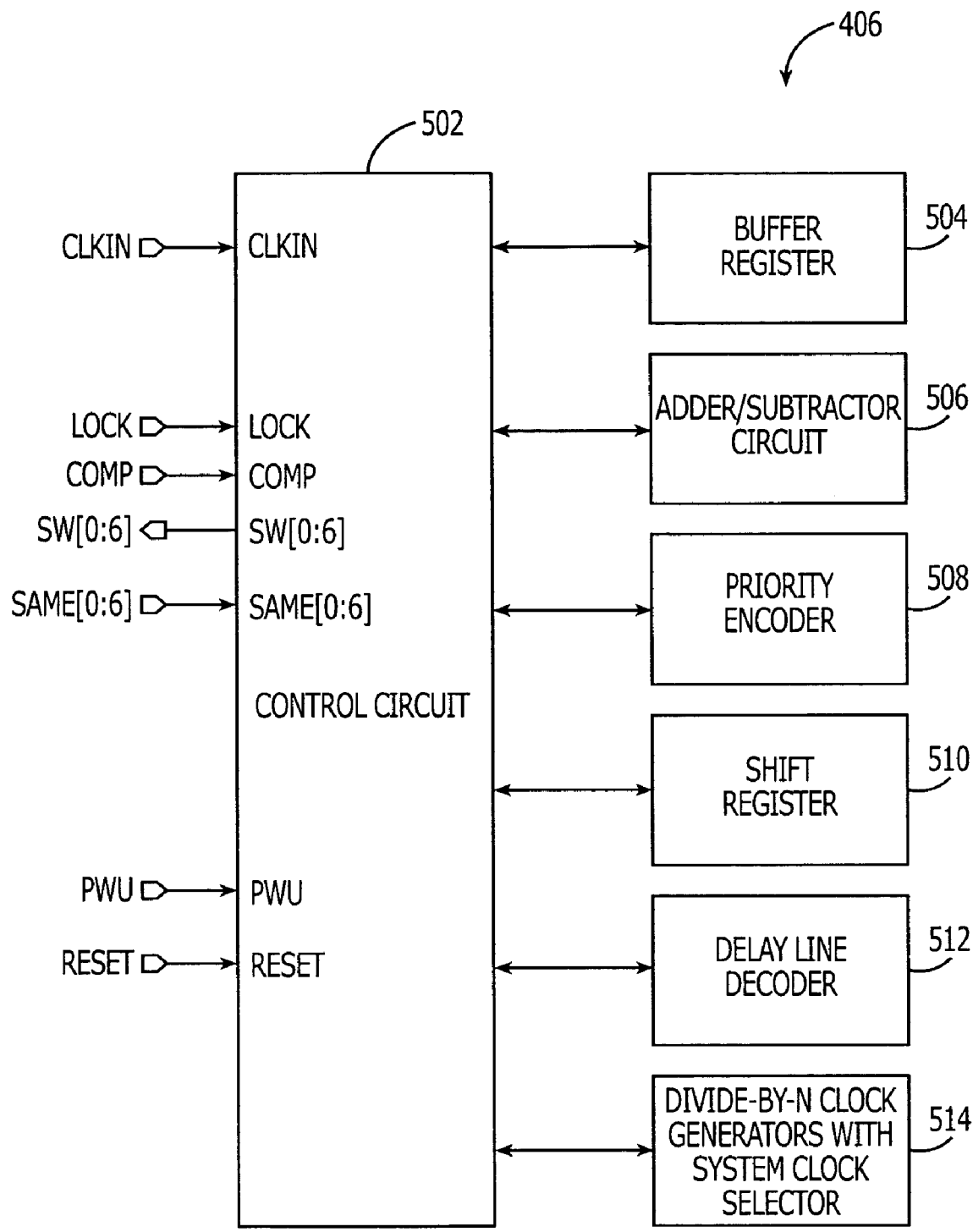
FIG. 5E illustrates a block diagram of a delay chain control circuit that may be used in the delay-locked loop integrated circuit of FIG. 4A.

Referring now to FIGS. 4C, 5A and 5E, the power-up operations, Block 420, may include an operation to force the delay chain 402 to its halfway point, Block 420a. This involves enabling one delay chain unit at a middle of the delay chain 402 (e.g., DCU_x8) and disabling all remaining delay chain units by removing them from an active delay path within the delay chain 402. An operation is also performed to generate a plurality of internal divide-by-N clock signals in response to the reference clock signal, Block 420b. As illustrated and described more fully in the aforementioned '318 application, the plurality of divide-by-N clock signals may include divide-by-2, divide-by-3, divide-by-4, divide-by-5, divide-by-6, divide-by-8, divide-by-9 and divide-by-10 clock signals, which are synchronized with the reference clock signal. These clock signals allow for the selection of a higher frequency system clock signal as the frequency of the reference clock signal increases and a shorter locking time is required.

The delay chain 402 also generates a multi-bit delay value signal SAME[0:6], Block 420c. This delay value signal SAME identifies all of the delay chain units (DCUs) that are configured to provide a delay in excess of one-half the period of the reference clock signal. Thus, with reference to FIG. 5A, if the delay chain units 404_16, 404_32 and 404_64 are configured to provide a delay in excess of one-half the period of a particular reference clock signal, then the multi-bit delay value signal SAME[0:6] may equal [0000111]. In response to the multi-bit delay value signal SAME, the delay chain control circuit 406 selects the smallest delay chain unit from the group identified as providing an excessive delay, Block 420d. In the specified example, this operation would select the fifth delay chain unit 404_16. This selection operation is performed by the priority encoder 508, which generates an encoded output signal (not shown) in response to the multi-bit delay value signal SAME, and the delay line decoder 512, which generates a multi-bit decode signal (not shown) in response to the encoded output signal generated by the priority encoder 508. These operations are performed under the control of the control circuit 502.

Delay preset operations are then performed by loading the identity of the selected delay chain unit DCU into the buffer register 504 and into the shift register 510, under the control of the control circuit 502, Block 420e. This identity is specified by the multi-bit decode signal generated by the delay line decoder 512. The identity of the smallest delay chain unit DCU is also used by the system clock selector 514 to select one of a plurality of divide-by-N clock signals as a system clock signal. This system clock signal is used to control timing of operations within the delay chain control circuit 406, Block 420f. These divide-by-N clock signals are generated by respective clock generators that receive the reference clock signal as a synchronization signal. Accordingly, if N=2, 3, 4, 5, 6, 8, 9 and 10, then the selection of the fifth delay chain unit 404_16 during power-up will cause the system clock signal to have a period equal to 6× the period of the reference clock signal. Once the system clock signal has been selected, Block 420f, the control circuit 502 operates to terminate the power-up operations in-sync with the selected system clock signal, Block 420g, and thereafter the progressive binary search operations commence, Block 440, at a rate dictated by the selected system clock signal. Accordingly, as the frequency of the reference clock signal increases and a smaller delay chain unit is selected during power-up, the frequency of the system clock signal increases to yield a faster search operation rate and shorter lock time.

The progressive binary search operations include using the current value stored within the buffer register 504 to set the initial value of the multi-bit delay unit enable signal SW[0:6] generated by the control circuit 502, Block 440a. The value stored within the shift register 510 is then updated to one-half its current value by the control circuit 502, Block 440b. During these operations, the phase comparator 404 operates to compare the phases of the reference and feedback clock signals, Block 440c, and a check is made to determine whether a lock condition is present, Block 440d. If a lock condition is not present, then the value of the compare signal COMP is used by the delay chain control circuit 406 to add/subtract the current value of the shift register 510 to/from the value stored within the buffer register 504 and then the buffer register 504 is updated with this new value, Block 440e. For example, if the compare signal COMP is set to a logic 1 value, an operation may be performed to add the current value of the shift register 510 to the value stored within the buffer register 504. Alternatively, if the compare signal is set to a logic 0 value, an operation may be performed to subtract the current value of the shift register 510 from the value stored within the buffer register 504.

The output of the buffer register 504 may then be used to generate an updated multi-bit delay unit enable signal SW[0:6], Block 440f. This update is preferably synchronized with the output of the system clock selector 514, which represents the system clock used by the control circuit 502. Accordingly, the maximum rate of update of the multi-bit delay unit enable signal SW[0:6] during the progressive binary search operations is a function of the value of the multi-bit delay value signal SAME[0:6] generated during the power-up operations, which is a function of the reference clock signal frequency. The shift register 510 is then updated with half its current value, Block 440g, to achieve a next step in the progressive binary search operation. Control is then returned to Block 440c. The operations illustrated by Blocks 440c–440g are then repeated as many times as necessary to achieve a phase-locked condition, Block 440d.

As illustrated by FIG. 5A, the binary-weighted delay chain 402 of FIG. 4A may include a plurality of delay chain units 404_1–404_64, which are illustrated as being arranged in ascending order according to delay. Other arrangements of the delay chain units within the delay chain 402 are also possible. The first two delay chain units 404_1 and 404_2 are illustrated more fully by FIG. 5B and the remaining five delay chain units 404_4–404_64 are illustrated more fully by FIG. 5C. Each of the delay chain units (DCUs) includes a delay path, a bypass path and a built-in phase comparator. The delay and bypass paths include first and second inverters I1 and I2, first and second NAND gates ND1 and ND2, a NOR gate NR1 and a delay element 408, which is illustrated more fully as a string of inverters in FIG. 5D. The bypass path is enabled when a corresponding bit (i.e., SW[n]) of the multi-bit delay unit enable signal SW[0:6] is set to a logic 0 value and the output of inverter I1 is switched low-to-high to thereby enable the first NAND gate ND1. When this condition is present, the corresponding delay chain unit DCU is essentially removed from the serial delay path provided by the delay chain 402. In contrast, when SW[n] is set to a logic 1 value, the delay path is enabled through the delay element 408 and the second NAND gate ND2, and the bypass path is blocked. The phase comparator includes third, fourth and fifth inverters I3, I4 and I5, first and second D-type flip-flops FF1 and FF2 and a NOR gate NR2. The signals MID($2^n-1$) and NMID($2^n-1$) are derived from an output of the delay element 408 and provided as inputs to the first and second flip-flops FF1 and FF2, as illustrated. The input IN to the delay chain unit DCU is provided as a clock input to the flip-flops, which generate signals SM0 and SM1. These signals SM0 and SM1 are logically OR'ed to thereby generate a respective bit of the multi-bit delay value signal SAME[0:6]. Based on this configuration of the phase comparator within the delay chain unit DCU, the signal SAME in FIG. 5B is set to a logic 1 value whenever the delay provided by the corresponding delay element 408 is greater than one-half the period of the signal provided to the input IN of the delay chain unit, which equals the period of the reference clock signal received by the delay chain 402.

The remaining delay chain units 404_4–404_64 of FIG. 5C are similar to the delay chain units illustrated by FIG. 5B, however, the phase comparator illustrated in FIG. 5C includes three D-type flip-flops FF3, FF4 and FF5 and a three-input NOR gate NR3. The signal MID($2^{(n-1)}+1$) is also used in addition to the signals MID($2^n-1$) and NMID($2^n-1$), which are derived from an output of the delay element 408. As illustrated by FIG. 5D, the signal MID($2^{(n-1)}+1$) is derived by tapping off a corresponding node in the inverter string within the delay element 408, where "n" is a positive integer having the values shown by FIG. 5A. This inverter string is illustrated as including the inverters INVM0–INVM ($2^n-1$).

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. A locked loop integrated circuit, comprising:
a delay chain responsive to a reference clock signal, said delay chain comprising a plurality of delay chain units arranged in ascending or descending order therein; and
a control circuit electrically coupled to said delay chain, said control circuit having a clock generator therein comprising:
a plurality of divide-by-N clock generators responsive to the reference clock signal, said plurality of divide-by-N clock generators having different N values; and
a clock selector electrically coupled to said plurality of divide-by-N clock dividers and configured to select an output of one of the plurality of divide-by-N clock dividers as a control circuit clock, in response a signal generated by said delay chain.

2. A delay-locked loop integrated circuit, comprising:
a delay chain configured to generate a multi-bit delay value signal in response to a reference clock signal; and
a delay chain control circuit electrically coupled to said delay chain, said delay chain control circuit comprising a plurality of clock generators responsive to the reference clock signal and a system clock selector configured to generate an internal clock signal received by said delay chain control circuit in response to a plurality of clock signals generated at outputs of the plurality of clock generators and the multi-bit delay value signal.

3. A delay-locked loop integrated circuit, comprising:
a delay chain configured to generate a multi-bit delay value signal in response to a reference clock signal; and
a delay chain control circuit responsive to the reference clock signal and the multi-bit delay value signal, said delay chain control circuit configured to generate an internal clock signal having a period that is a function of a value of the multi-bit delay value signal.

4. The circuit of claim 3, wherein said delay chain is further responsive to a multi-bit delay unit enable signal generated by said delay chain control circuit; and wherein said delay chain control circuit is configured to update the multi-bit delay unit enable signal in-sync with the internal clock signal.

5. A method of operating a locked loop integrated circuit, comprising the steps of:
evaluating a plurality of binary-weighted delays provided by a corresponding plurality of delay chain units within a delay chain responsive to a reference clock signal, to thereby identify a first one of the plurality of delay chain units having a first delay in excess of a fraction of a period of the reference clock signal; and
removing a second one of the plurality of delay chain units having a second delay in excess of the first delay from a delay path of the delay chain, in response to identifying the first one of the plurality of delay chain units as having the first delay.

6. The method of claim 5, further comprising the steps of:
generating a compare signal that identifies a leading or lagging phase relationship between the reference clock signal and a feedback clock signal derived from an output of the delay chain; and
performing a progressive binary search of a lock condition in the locked loop integrated circuit using the compare signal to control adjustments to the delay of the delay chain.

7. A method of operating a locked loop integrated circuit, comprising the steps of:
generating a multi-bit signal that identifies a plurality of delay chain units within a binary-weighted digital delay line that provide a delay greater than one-half a period of a reference clock signal received at an input of the digital delay line; and
setting a delay of the binary-weighted digital delay line to substantially match a delay of a smallest one of the identified plurality of delay chain units.

* * * * *